(12) United States Patent
Marc

(10) Patent No.: US 9,685,598 B2
(45) Date of Patent: Jun. 20, 2017

(54) THERMOELECTRIC DEVICE

(71) Applicant: NOVATION IQ LLC, Lenexa, KS (US)

(72) Inventor: Michel Marc, Lenexa, KS (US)

(73) Assignee: Novation IQ LLC, Lenexa, KS (US)

( * ) Notice: Subject to any disclaimer, the term of this patent is extended or adjusted under 35 U.S.C. 154(b) by 0 days.

(21) Appl. No.: 14/533,321

(22) Filed: Nov. 5, 2014

(65) Prior Publication Data

US 2016/0126438 A1    May 5, 2016

(51) Int. Cl.
| | | |
|---|---|---|
| *H01L 35/30* | (2006.01) | |
| *H01L 35/32* | (2006.01) | |
| *H01L 35/10* | (2006.01) | |

(52) U.S. Cl.
CPC ............. *H01L 35/10* (2013.01); *H01L 35/30* (2013.01); *H01L 35/32* (2013.01)

(58) Field of Classification Search
CPC .......... H01L 35/00; H01L 35/32; H01L 35/08
USPC ........................................................ 136/211
See application file for complete search history.

(56) References Cited

U.S. PATENT DOCUMENTS

| | | | | |
|---|---|---|---|---|
| 3,561,224 | A * | 2/1971 | Banks et al. ............ | F25B 21/02 136/203 |
| 3,830,664 | A * | 8/1974 | Winkler ................. | G21H 1/103 136/202 |
| 5,006,178 | A * | 4/1991 | Bijvoets .................. | H01L 35/32 136/203 |
| 6,225,550 | B1 | 5/2001 | Hornbostel et al. | |
| 6,233,944 | B1 | 5/2001 | Yamada et al. | |
| 6,672,076 | B2 * | 1/2004 | Bell ........................ | F02G 1/043 136/200 |
| 2008/0135082 | A1 | 6/2008 | Hirono et al. | |

(Continued)

FOREIGN PATENT DOCUMENTS

| | | |
|---|---|---|
| TW | M363683 | 8/2009 |
| WO | WO 2014/065910 A1 | 7/2013 |

OTHER PUBLICATIONS

Adee, Sally, "Thermoelectric Efficiency Boost is Good News for Solar", *NewScientist*, 14:41, Sep. 26, 2012 (4 pgs).

(Continued)

*Primary Examiner* — Jayne Mershon
(74) *Attorney, Agent, or Firm* — Stinson Leonard Street LLP

(57) ABSTRACT

The present invention is directed to a thermoelectric device that includes a plurality of thermoelectric couples positioned between a top plate and a bottom plate, wherein each thermoelectric couple comprises n-type and p-type element assemblies electrically connected in series and thermally connected in parallel. When the device is used for electrical power generation, the efficiency is increased by using semiconductor materials with a high Seebeck coefficient, increasing the distance between the n-type and p-type element assemblies, increasing the length of the electrical conductors/thermal distance between the top and bottom plates, and/or using an insulation plate spaced from the top plate. When the device is used for heating/cooling, the coefficients of performance are increased by using semiconductor materials with a high Seebeck coefficient and/or optimizing the length of the electrical conductors/thermal distance between the top and bottom plates.

11 Claims, 5 Drawing Sheets

(56) References Cited

U.S. PATENT DOCUMENTS

| | | | |
|---|---|---|---|
| 2008/0230110 A1* | 9/2008 | Freedman | B82Y 30/00 |
| | | | 136/246 |
| 2012/0042661 A1 | 2/2012 | Danenberg et al. | |
| 2012/0090657 A1 | 4/2012 | Lee et al. | |
| 2012/0096871 A1* | 4/2012 | Wang | F25B 21/02 |
| | | | 62/3.2 |
| 2012/0180842 A1 | 7/2012 | Chen et al. | |
| 2012/0308807 A1 | 12/2012 | Edwards | |
| 2013/0026427 A1* | 1/2013 | Backhaus-Ricoult | C04B 35/47 |
| | | | 252/519.12 |
| 2013/0160808 A1 | 6/2013 | Hsu et al. | |
| 2015/0013738 A1* | 1/2015 | Lu | H01L 35/30 |
| | | | 136/201 |

OTHER PUBLICATIONS

Biswas, Kanishka et al., "High-Performance Bulk Thermoelectrics with All-Scale Hierarchical Architectures", *Nature*, vol. 489, pp. 414-418, Sep. 20, 2012 (5 pgs).

Pellai et al., "Thermal Conductivity of LaCoO3," International Journal of Thermophysics, Jun. 1983, vol. 4, Issue 2, (Jun. 1984), abstract [online] <URL:http://link.springer.com/article/10.1007%2FBF00500141>.

International Search Report and Written Opinion for related PCT Application PCT/US15/57035 dated Mar. 4, 2016 (12 pgs).

\* cited by examiner

THERMOELECTRIC DEVICE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

Thermoelectric devices are available in a variety of materials and configurations. Referring to FIG. 1, a conventional thermoelectric device is shown generally as reference numeral 10. Thermoelectric device 10 includes a plurality of thermoelectric couples 12a and 12b (only two of which are shown in FIG. 1). As shown, each thermoelectric couple comprises an n-type semiconductor element 14 and a p-type semiconductor element 16. The n-type and p-type semiconductor elements 14, 16 are electrically connected in series via connection plates 18a, 18b, 18c, 18d and 18e, as shown in FIG. 1. In addition, the n-type and p-type semiconductor elements 14, 16 are thermally connected in parallel between a top plate 20 and a bottom plate 22. Within each thermoelectric couple, the n-type and p-type semiconductor elements 14, 16 are spaced a short distance apart (represented by distance d in FIG. 1) in order to minimize the overall size of the device. For example, a typical distance between n-type and p-type semiconductor elements 14, 16 is in the range of 0.5 mm to 2.0 mm.

In general, thermoelectric devices are used in two different modes of operation: an electrical power generation mode and a heating/cooling mode. In this regard, thermoelectric device 10 includes contact points 24 and 26 that provide connections to either a load (for the electrical power generation mode) or a power source (for the heating/cooling mode), wherein the load or power source are shown generally as reference numeral 40. In the electrical power generation mode, heat (e.g., heat from the sun) is applied to top plate 20 whereby electrical power is delivered to the load connected to contact points 24 and 26. In the heating/cooling mode, the power source is connected to contact points 24 and 26 whereby the temperature of each of top and bottom plates 20, 22 changes to provide the desired heating or cooling effect.

While conventional thermoelectric devices offer advantages that are not provided by other technologies, they are still relatively inefficient. In the electrical power generation mode, the efficiency of a thermoelectric device increases with a greater temperature difference between top plate 20 and bottom plate 22. This is accomplished by selecting the materials of each of the n-type and p-type semiconductor elements 14, 16 to have a low thermal conductivity (e.g., a thermal conductivity of 0.026 W/cm° K or lower). However, materials with a low thermal conductivity generally have a low Seebeck coefficient (e.g., a Seebeck coefficient of 140 µV/° K to 250 µV/° K for the p-type semiconductor element and a Seebeck coefficient of −75 µV/° K to −200 µV/° K for the n-type semiconductor element). For example, $Bi_2Te_3$ is commonly used for the p-type semiconductor element 16, which has a thermal conductivity of about 0.020 W/cm° K and a Seebeck coefficient of about 240 µV/° K. Also, $Bi_2Te_3$+0.1% I is commonly used for the n-type semiconductor element 14, which has a thermal conductivity of about 0.0256 W/cm° K and a Seebeck coefficient of about −184 µV/° K. In addition, materials with a low thermal conductivity generally have a low electrical conductivity, which does not provide optimum efficiency. While efforts have been made to develop materials with a low thermal conductivity and higher Seebeck coefficients and electrical conductivity, there are still limits on the efficiency that can be achieved with the use of these materials. In particular, the efficiency of a conventional thermoelectric device is typically less than about 15%. There are similar limits on the coefficient of performance for cooling or refrigeration (COPR) and the coefficient of performance for heating (COPH) that may be achieved with the use of such materials when a conventional thermoelectric device is operated in the heating/cooling mode.

Another measure of the performance of a thermoelectric device when operating in the electrical power generation mode is ZT, where Z is the figure of merit of the device and T is the mean temperature of the device. The ZT value of a conventional thermoelectric device is typically less than about 1.5 and most typically about 1, although a recent publication claims to have attained a ZT value of about 2.2 at 600° K. See *High-performance bulk thermoelectrics with all-scale hierarchial architectures*, Nature 489, 414-418 (Sep. 20, 2012). Even if such claims are accurate, a ZT value of 2.2 is still well below desired levels.

U.S. Pat. No. 5,006,178 to Bijvoets discloses an alternative thermoelectric device that includes a plurality of thermoelectric elements electrically connected in series and thermally connected in parallel. Each thermoelectric element is provided with two element halves of opposite conductivity types. Each element half has two semiconducting end pieces and an electrically conducting intermediate piece. Bijvoets teaches that the semiconducting end pieces are made of typical semiconductor materials, such as BiTe. Again, there are limits on the efficiency, ZT value, COPH and COPR that can be achieved with these materials.

BRIEF SUMMARY OF THE INVENTION

The present invention is directed to a high efficiency thermoelectric device that may be used for electrical power generation or for heating/cooling applications. The thermoelectric device includes a plurality of thermoelectric couples positioned between a top plate and a bottom plate. Each thermoelectric couple comprises an n-type element assembly and a p-type element assembly that are electrically connected in series and thermally connected in parallel. The n-type element assembly comprises a first n-type semiconductor element connected to a second n-type semiconductor element via a first electrical conductor, wherein the first and second n-type semiconductor elements are electrically and thermally connected in series. The p-type element assembly comprises a first p-type semiconductor element connected to a second p-type semiconductor element via a second electrical conductor, wherein the first and second p-type semiconductor elements are electrically and thermally connected in series. Preferably, the top and bottom plates are formed of a material having a high thermal conductivity and a low electrical conductivity.

When the thermoelectric device is used for electrical power generation, the efficiency (and ZT value) can be increased by one or more of the following: using semiconductor materials for the n-type and/or p-type semiconductor elements with higher Seebeck coefficients; increasing the distance between the n-type and p-type element assemblies; increasing the length of the electrical conductors and thermal distance between the top and bottom plates; using top and bottom plates that are black in color and have very low electrical conductivity and high thermal conductivity; and/or providing an insulation plate above the top plate to reduce the amount of heat that is lost to the ambient air.

When the thermoelectric device is used for heating/cooling applications, the COPH and/or COPR can be increased by one or more of the following: using semiconductor materials for the n-type and/or p-type semiconductor elements with higher Seebeck coefficients; and/or optimizing the length of the electrical conductors and thermal distance between the top and bottom plates. The top plate is coupled to a first heat sink and the bottom plate is coupled to a second heat sink. Preferably, the second heat sink is moveable between an open position and a closed position, wherein the second heat sink is in the closed position when the device is configured for use as a heating device and is in the open position when the device is configured for use as a cooling device.

A thermoelectric device in accordance with the present invention is able to provide significantly higher efficiency, ZT value, COPH and COPR than those attainable with conventional thermoelectric devices.

BRIEF DESCRIPTION OF THE DRAWINGS

Various exemplary embodiments of the present invention are described in detail below with reference to the attached drawing figures, wherein.

DETAILED DESCRIPTION OF EXEMPLARY EMBODIMENTS

The present invention is directed to a high efficiency thermoelectric device that may be used for electrical power generation or for heating/cooling applications. While the invention will be described in detail below with reference to various exemplary embodiments of the invention, it should be understood that the invention is not limited to the specific configuration or materials of these embodiments. In addition, although the exemplary embodiments are described as embodying several different inventive features, one skilled in the art will appreciate that any one of these features could be implemented without the others in accordance with the invention.

I. Electrical Power Generation

Figure 2:
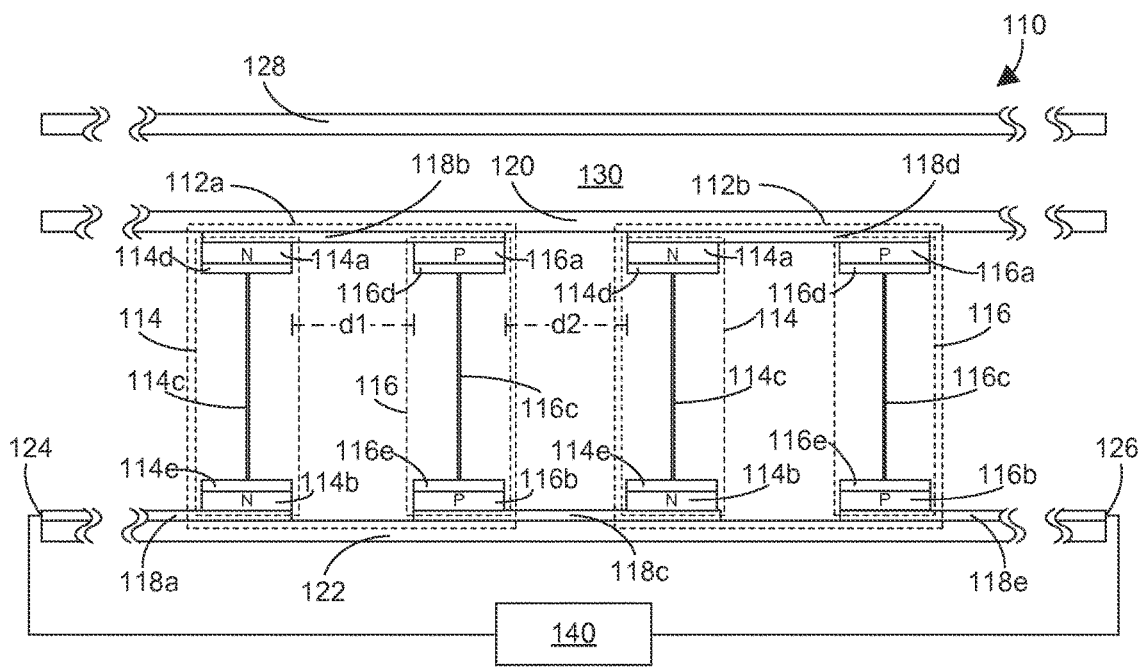
FIG. 2 is a diagram of a thermoelectric device used for electrical power generation in accordance with a first exemplary embodiment of the present invention.

Referring to FIG. 2, a first exemplary embodiment of a thermoelectric device used for electrical power generation in accordance with the present invention is shown generally as reference numeral 110. Thermoelectric device 110 includes a plurality of thermoelectric couples 112a, 112b positioned between a top plate 120 and a bottom plate 122. While two thermoelectric couples 112a, 112b are depicted in FIG. 2, it should be understood that thermoelectric device 110 may include any number of thermoelectric couples. In one aspect, the thermoelectric couples are arranged in a grid pattern, such as a square grid pattern in which thermoelectric device 110 has the same number of element assemblies along its length and width. Of course, other patterns of element assemblies are also within the scope of the present invention. In another aspect, multiple thermoelectric devices or modules are connected in series and/or in parallel as desired for a particular application or to achieve a desired result.

In the exemplary embodiment, all of the thermoelectric couples are substantially identical, e.g., the configuration of thermoelectric couple 112a is substantially the same as the configuration of thermoelectric couple 112b. Each thermoelectric couple includes an n-type element assembly 114 and a p-type element assembly 116. The thermoelectric couples are electrically connected in series via connection plates 118a, 118b, 118c, 118d and 118e, as shown, such that the device electrically alternates between an n-type element assembly 114 and a p-type element assembly 116. As can be seen, the thermoelectric couples are thermally connected in parallel between top plate 120 and bottom plate 122.

Each n-type element assembly 114 comprises two n-type semiconductor elements 114a, 114b with connection plates 114d, 114e, respectively, connected in series by an electrical conductor 114c. N-type semiconductor elements 114a, 114b are thermally connected in series between top plate 120 and bottom plate 122. Similarly, each p-type element assembly 116 comprises two p-type semiconductor elements 116a, 116b with connection plates 116d, 116e, respectively, connected in series by an electrical conductor 116c. P-type semiconductor elements 116a, 116b are thermally connected in series between top plate 120 and bottom plate 122.

N-type semiconductor elements 114a, 114b are formed of a semiconductor material that has been doped with certain compounds such that the semiconductor material has an excess of negative electron charge carriers. One skilled in the art will understand that the specific material properties (e.g., Seebeck coefficient, thermal conductivity, and electrical resistivity) of n-type semiconductor elements 114a, 114b will vary depending on the semiconductor material used in the device. As described in detail below, the efficiency of thermoelectric device 110 may be increased by selecting a semiconductor material for n-type semiconductor elements 114a, 114b that has a large negative value for the Seebeck coefficient at the temperature at which the device will be operated and a relatively small value for the electrical resistivity. In a preferred embodiment, n-type semiconductor elements 114a, 114b are formed of a material in which the negative value for the Seebeck coefficient is greater than about −250 µV/° K, e.g., −250, −300, −350, −400, −450, −500, −550, −600, −650, −700, −750, −800, −850, −900, −950, −1000, −1050, −1100, −1150, −1200, −1250, −1300 or greater µV/° K. Also, in a preferred embodiment, n-type semiconductor elements 114a, 114b are formed of a material in which the electrical resistivity is less than about $1.0 \times 10^{-1}$ ohms·cm, more preferably less than about $1.0 \times 10^{-2}$ ohms·cm, and most preferably less than about $1.0 \times 10^{-3}$ ohms·cm. While a lower electrical resistivity is generally preferred, the value of the electrical resistivity must be considered relative to the value of the Seebeck coefficient. For example, a material with a higher electrical resistivity and higher Seebeck coefficient may be preferred over another material with a lower electrical resistivity and lower Seebeck coefficient. Suitable materials for n-type semiconductor elements 114a, 114b include, but are not limited to, $Bi_2S_3$ (sintered), $Pb_{09}Ge_{33}Se_{58}$, and $Pb_{15}Ge_{37}Se_{58}$. Unlike conventional thermoelectric devices, the thermal conductivity of the semiconductor material is not critical to the efficiency of thermoelectric device 110. Thus, n-type semiconductor elements 114a, 114b may be formed of a material in which the thermal conductivity is greater than about 0.10 W/cm °K, e.g., 0.10, 0.12, 0.14, 0.16, 0.18, 0.20, 0.22, 0.24 or greater W/cm °K.

P-type semiconductor elements 116a, 116b are formed of a semiconductor material that has been doped with certain compounds such that the semiconductor material has an excess of charge carriers (holes). One skilled in the art will understand that the specific material properties (e.g., Seebeck coefficient, thermal conductivity, and electrical resistivity) of p-type semiconductor elements 116a, 116b will vary depending on the semiconductor material used in the device. As described in detail below, the efficiency of thermoelectric device 110 may be increased by selecting a semiconductor material for p-type semiconductor elements 116a, 116b that has a large positive value for the Seebeck coefficient at the temperature at which the device will be operated and a small value for each of the thermal conductivity and electrical resistivity. In a preferred embodiment, p-type semiconductor elements 116a, 116b are formed of a material in which the positive value for the Seebeck coefficient is greater than about 250 µV/°K, e.g., 250, 300, 350, 400, 450, 500, 550, 600, 650, 700, 750, 800, 850, 900, 950, 1000, 1050, 1100, 1150, 1200, 1250, 1300 or greater µV/°K. Also, in a preferred embodiment, p-type semiconductor elements 116a, 116b are formed of a material in which the electrical resistivity is less than about $1.0 \times 10^{-1}$ ohms·cm, more preferably less than about $1.0 \times 10^{-2}$ ohms·cm, and most preferably less than about $1.0 \times 10^{-3}$ ohms·cm. While a lower electrical resistivity is generally preferred, the value of the electrical resistivity must be considered relative to the value of the Seebeck coefficient. For example, a material with a higher electrical resistivity and higher Seebeck coefficient may be preferred over another material with a lower electrical resistivity and lower Seebeck coefficient. Suitable materials for p-type semiconductor elements 116a, 116b include, but are not limited to, $Bi_2Te_3$, $Pb_{03}Ge_{39}Se_{58}$, and $Pb_{06}Ge_{36}Se_{58}$. Again, unlike conventional thermoelectric devices, the thermal conductivity of the semiconductor material is not critical to the efficiency of thermoelectric device 110. Thus, p-type semiconductor elements 116a, 116b may be formed of a material in which the thermal conductivity is greater than about 0.10 W/cm °K, e.g., 0.10, 0.12, 0.14, 0.16, 0.18, 0.20, 0.22, 0.24 or greater W/cm °K.

As described in detail below, the dimensions of n-type semiconductor elements 114a, 114b and p-type semiconductor elements 116a, 116b can be altered to maximize the efficiency of thermoelectric device 110. In the exemplary embodiment, the dimensions of n-type semiconductor elements 114a, 114b are substantially identical to the dimensions of p-type semiconductor elements 116a, 116b. In an alternative embodiment, the dimensions of n-type semiconductor elements 114a, 114b are different than the dimensions of p-type semiconductor elements 116a, 116b. In a preferred embodiment, the thickness of n-type semiconductor elements 114a, 114b and p-type semiconductor elements 116a, 116b is about 2.0 mm or less, e.g., 2.0, 1.9, 1.8, 1.7, 1.6, 1.5, 1.4, 1.3, 1.2, 1.1, 1.0. 0.9, 0.8 or less mm.

The distance between each n-type element assembly 114 and corresponding p-type element assembly 116 is shown in FIG. 2 as d1. The distance between adjacent thermoelectric couples (e.g., the distance between thermoelectric couple 112a and thermoelectric couple 112b) is shown in FIG. 2 as d2. In the exemplary embodiment, the value of d1 is substantially the same as the value of d2. Unlike conventional thermoelectric devices, there is no limit on the values of d1 and d2 (i.e., the value of d1 and d2 in FIG. 2 can be greater than the value of d in FIG. 1). Preferably, the value of d1 and d2 is chosen so as to provide the greatest efficiency in relation to the desired power output for thermoelectric device 110. In a preferred embodiment, the value of d1 and d2 is between about 0.05 cm and about 3.0 cm.

N-type semiconductor elements 114a, 114b and p-type semiconductor elements 116a, 116b are electrically connected in series via electrical conductors 114c, 116c and connections 114d, 114e, 116d, 116e, respectively, and connection plates 118a, 118b, 118c, 118d and 118e. In one embodiment, electrical conductors 114c, 116c, connections 114d, 114e, 116d, 116e, and connection plates 118a, 118b, 118c, 118d and 118e are made from the same material. In another embodiment, electrical conductors 114c, 116c, connections 114d, 114e, 116d, 116e, and connection plates 118a, 118b, 118c, 118d and 118e are made from different materials. Examples of suitable materials for electrical conductors 114c, 116c, connections 114d, 114e, 116d, 116e, and connection plates 118a, 118b, 118c, 118d and 118e include, but are not limited to, nickel, aluminum, copper, silver, zinc, and solder.

Electrical conductors 114c, 116c and connections 114d, 114e and 116d, 116e are preferably made of a material having a low thermal conductivity and a high electrical conductivity. The material is preferably chosen so as to maximize the ratio of electrical conductivity to thermal conductivity. In a preferred embodiment, the ratio of electrical conductivity to thermal conductivity is in a range of about $1.3 \times 10^5$ S° K/W to about $1.6 \times 10^5$ S° K/W and greater. Preferably, electrical conductor 114c and connections 114d, 114e are made from an electrically conductive material with a negative Seebeck coefficient (e.g., nickel) and electrical conductor 116c and connections 116d, 116e are made from an electrically conductive material with a positive Seebeck coefficient (e.g., copper). Solder could also be used for connections 114d, 114e and 116d, 116e so as to reduce the cost of manufacturing.

Connection plates 118a, 118b, 118c, 118d and 118e are preferably made of a material having a high thermal conductivity and a high electrical conductivity (e.g., silver, copper or aluminum). Of course, one skilled in the art will understand that the materials may be chosen in view of cost considerations, e.g., while silver has a high thermal conductivity, it may be sufficient to use copper or aluminum in view of their lower costs.

The length and diameter of electrical conductors 114c, 116c affect the efficiency of thermoelectric device 110 and the amount of current that can safely travel through device 110. It is desired to maximize the length of electrical conductors 114c, 116c (and increase the thermal distance between top plate 120 and bottom plate 122) and minimize the diameter of electrical conductors 114c, 116c so as to lower the amount of heat transferred between top plate 120 and bottom plate 122. This results in a larger temperature difference between top plate 120 and bottom plate 122 to thereby increase the efficiency of thermoelectric device 110.

In a preferred embodiment, electrical conductors 114c, 116c have a length in a range from about 2 cm to about 8 cm, although could be as long as 3 m or more in certain applications. Also, in a preferred embodiment, electrical conductors 114c, 116c have a diameter in a range from about 0.51054 mm (24 AWG) to about 3.66522 mm (7 AWG). In the exemplary embodiment, electrical conductors 114c, 116c are substantially identical so as to have substantially the same length and diameter. In an alternative embodiment, electrical conductor 114c has a different length and/or diameter compared to those of electrical conductor 116c. One skilled in the art will understand that if the dimensions of n-type semiconductor elements 114a, 114b and p-type semiconductor elements 116a, 116b are different, then electrical conductors 114c, 116c may have different lengths such that the overall thermal distance between top plate 120 and bottom plate 122 for each element assembly 114, 116 is substantially the same.

In the exemplary embodiment, top plate 120 and bottom plate 122 are made from a material having a high thermal conductivity and a low electrical conductivity. One suitable material for top and bottom plates 120, 122 is Ceramacast™ 675N (ceramic doped with aluminum nitride) available from Aremco Products Inc., which can be used at higher temperatures up to 2200° F. Another suitable material is Cool-Poly® D5108 (polyphenylene sulfide (PPS)) available from Cool Polymers, Inc. It is also possible to mix a filler, such as boron nitride, aluminum oxide, or aluminum nitride, with either of these materials. Of course, other materials may also be used in accordance with the present invention.

In some embodiments, thermoelectric device 110 also includes an insulating plate 128 spaced a distance above top plate 120. Insulating plate 128 allows heat to pass from a heat source to top plate 120, and also provides an insulation layer so as to prevent the dissipation and loss of heat from top plate 120 into the surrounding ambient air. Preferably, insulating plate 128 is transparent so to pass as much heat as possible from the heat source to top plate 120. Suitable materials for insulating plate 128 include glass or acrylic. Of course, other materials may also be used in accordance with the present invention.

In the exemplary embodiment, an insulation area 130 is provided between insulation plate 128 and top plate 120, as shown in FIG. 2. In an alternative embodiment, the insulation area may extend between insulation plate 128 and bottom plate 122. The insulation area 130 is preferably a vacuum or partial vacuum. Alternatively, insulation area 130 may comprise a gas (such as air or argon) that is maintained at atmospheric pressure, below atmospheric pressure, or above atmospheric pressure. In this embodiment, thermoelectric device 110 includes side membranes (not shown) or other means of enclosing insulation area 130 between insulation plate 128 and top plate 120 (or bottom plate 122), preferably with a rubber seal. One skilled in the art will understand that insulation area 130 reduces the dissipation of heat from thermoelectric device 110 into the ambient air.

In the exemplary embodiment, thermoelectric device 110 is configured for power generation. As such, in FIG. 2, thermoelectric device 110 is coupled to a load 140 via connection points 124, 126 so as to provide electrical power to load 140. Load 140 may comprise any type of load that is operable to receive, use and/or store power generated by thermoelectric device 110.

In operation, a heat source (not shown) provides heat to one of the plates of thermoelectric device 110. In the exemplary embodiment, the heat is applied to top plate 120. The heat source may be any suitable source of heat and may be provided directly or indirectly, through convection or conduction, or any other heat transfer method known in the art. Examples of suitable heat sources include, but are not limited to, the sun, open flames, furnaces, engines, motors, appliances (e.g., refrigerator or water heater), living organisms, cooling towers, boilers, and chemical reactions.

When the heat source provides heat to top plate 120 (optionally through insulation plate 128), the temperature of top plate 120 increases resulting in a temperature difference (ΔT) between top plate 120 and bottom plate 122. This temperature difference excites the atoms in the semiconductor elements so that the atoms begin to move, which causes an electrical current to flow in thermoelectric device 110. This current is delivered to load 140 through connection points 124, 126.

A thermoelectric device is not perfectly efficient and energy is lost to the ambient air and to heat generated within the device. In general terms, the efficiency of a thermoelectric device is measured by the ratio of the energy provided to a load to the heat energy absorbed by the top plate. A thermoelectric device with higher efficiency will generate more power for the load. The efficiency of a thermoelectric device may be expressed by the following equation (wherein it is assumed that the plate receiving the heat input is the top plate):

$$\eta = \frac{\Delta T}{2T_h - \frac{\Delta T}{2} + \frac{4}{Z}} \quad (1)$$

where $\eta$=efficiency of thermoelectric device;

$\Delta T$=temperature difference between top plate and bottom plate in degrees Kelvin (° K);

$T_h$=temperature of top plate in degrees Kelvin (° K); and $Z$=figure of merit for thermoelectric device in 1/° K.

The figure of merit for a thermoelectric device is determined by the materials used to construct each of the thermoelectric couples of the device, as set forth in the following equation:

$$Z = \frac{S_{eq}^2}{R_{eq} \cdot K_{eq}} \quad (2)$$

where $Z$=figure of merit for thermoelectric device in 1/° K;

$S_{eq}$=equivalent Seebeck coefficient for single thermoelectric couple in μV/° K;

$R_{eq}$=equivalent electrical resistance for single thermoelectric couple in ohms; and $K_{eq}$=equivalent thermal conductance for single thermoelectric couple in W/° K.

The equivalent electrical resistance and equivalent thermal conductance are dependent on the electrical resistance and thermal conductance, respectfully, for the n-type and p-type semiconductor elements in a single thermoelectric couple. The equivalent electrical resistance represents how difficult it is for current to flow through the thermoelectric device. The equivalent thermal conductance represents how easily heat flows through the thermoelectric device. It will be seen that the equivalent electrical resistance and equivalent thermal conductance are calculated differently depending on the configuration of the thermoelectric device.

The electrical resistance for a p-type semiconductor element is dependent on the electrical resistivity of the material used to construct the element and the dimensions of the element, as shown by the following equation:

$$R_p = \rho_p \cdot \left(\frac{h_p}{SA_p}\right) \quad (3)$$

where $R_p$=electrical resistance for p-type semiconductor element in ohms;

$\rho_p$=electrical resistivity of material used for p-type semiconductor element in ohms·cm;

$h_p$=height of p-type semiconductor element in cm; and $SA_p$=cross-sectional surface area of p-type semiconductor element in cm².

Similarly, the electrical resistance for an n-type semiconductor element is dependent on the electrical resistivity of the material used to construct the element and the dimensions of the element, as shown by the following equation:

$$R_n = \rho_n \cdot \left(\frac{h_n}{SA_n}\right) \quad (4)$$

where $R_n$=electrical resistance for n-type semiconductor element in ohms;

$\rho_n$=electrical resistivity of material used for n-type semiconductor element in ohms·cm;

$h_n$=height of n-type semiconductor element in cm; and $SA_n$=cross-sectional surface area of n-type semiconductor element in cm².

The thermal conductance for a p-type semiconductor element is dependent on the thermal conductivity of the material used to construct the element and the dimensions of the element, as shown by the following equation:

$$K_p = k_p \cdot \left(\frac{SA_p}{h_p}\right) \quad (5)$$

where $K_p$=thermal conductance for p-type semiconductor element in W/° K;

$k_p$=thermal conductivity of material used for p-type semiconductor element in W/cm·° K;

$SA_p$=cross-sectional surface area of p-type semiconductor element in cm²; and $h_p$=height of p-type semiconductor element in cm.

Similarly, the thermal conductance for an n-type semiconductor element is dependent on the thermal conductivity of the material used to construct the element and the dimensions of the element, as shown by the following equation:

$$K_n = k_n \cdot \left(\frac{SA_n}{h_n}\right) \quad (6)$$

where $K_n$=thermal conductance for n-type semiconductor element in W/° K;

$k_n$=thermal conductivity of material used for n-type semiconductor element in W/cm·° K;

$SA_n$=cross-sectional surface area of n-type semiconductor element in cm²; and $h_n$=height of n-type semiconductor element in cm.

As can be seen from equation (1) above, the efficiency of a thermoelectric device can be increased by increasing the temperature difference between the top plate and the bottom plate and/or increasing the figure of merit for the thermoelectric device. As can be seen from equation (2) above, the figure of merit for the thermoelectric device can be increased (to thereby increase the efficiency) by increasing the equivalent Seebeck coefficient for a single thermoelectric couple, decreasing the equivalent electrical resistance for a single thermoelectric couple, and/or decreasing the equivalent thermal conductance for a single thermoelectric couple.

From these equations, it will be seen that the efficiency of a thermoelectric device in accordance with the present invention can be increased in one or more different ways, including: using semiconductor materials with higher Seebeck coefficients that are not suitable for use with a conventional thermoelectric device; increasing the distance between element assemblies in the thermoelectric device; increasing the length of the electrical conductors connecting the semiconductor elements and increasing the thermal distance between the top and bottom plates; and/or using an insulation plate above the top plate. Each of these methods of increasing the efficiency of the thermoelectric device will be discussed in greater detail below. Preferably, the efficiency of the thermoelectric device is greater than about 20%, e.g., 20%, 22%, 24%, 26%, 28%, 30%, 32%, 34%, 36%, 38%, 40% or even greater. It is believed that the maximum efficiency that can be obtained with current materials is in the range of 50% to 70%. Further, the ZT value of the thermoelectric device is preferably greater than 5, e.g., 5, 10, 15, 20, 25, 30, 35, 40, 45, 50 or even greater. Of course, one skilled in the art will understand that the ZT values that can be achieved with the present invention depend, in part, on the temperature difference between top plate 120 and bottom plate 122.

A. Change in Semiconductor Materials

Figure 1:
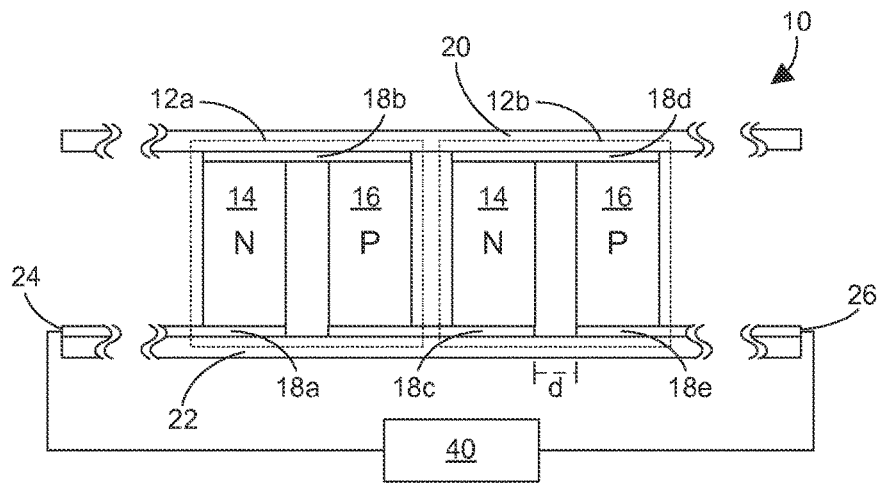
FIG. 1 is a diagram of a conventional thermoelectric device of the prior art.

In one aspect of the invention, the configuration of thermoelectric device 110 shown in FIG. 2 enables the use of semiconductor materials with higher Seebeck coefficients that are not suitable for use with conventional thermoelectric device 10 shown in FIG. 1. These semiconductor materials increase the efficiency (and ZT value) of thermoelectric device 110 by increasing the figure of merit. To illustrate this aspect of the invention, an example is provided below that compares the efficiency of conventional thermoelectric device 10 to the efficiency of thermoelectric device 110.

Thermoelectric Device 10 (Prior Art)

As discussed above, thermoelectric device 10 is comprised of n-type semiconductor elements 14 and p-type semiconductor elements 16. For purposes of this example, we will assume that n-type semiconductor elements 14 are made of $Bi_2Te_3$+0.1% I and p-type semiconductor elements 16 are made of $Bi_2Te_3$. We will also assume that semiconductor elements 14, 16 each have a length of 1 cm, a width of 1 cm, and a height of 0.05 cm. Table 1 is provided below to show the various properties for these semiconductor materials, namely, the Seebeck coefficient (S), the thermal conductivity (k), and the electrical resistivity (ρ) for each semiconductor material. These values will be used below to perform various calculations relating to the efficiency of thermoelectric device 10.

TABLE 1

|  | n-type semiconductor element (Bi$_2$Te$_3$ + 0.1% I) | p-type semiconductor element (Bi$_2$Te$_3$) |
|---|---|---|
| Seebeck coefficient (S) | $-184 \times 10^{-6}$ V/° K | $240 \times 10^{-6}$ V/° K |
| thermal conductivity (k) | 0.0256 W/(cm · ° K) | 0.02 W/(cm · ° K) |
| electrical resistivity (ρ) | $0.63 \times 10^{-3}$ ohms · cm | $0.52 \times 10^{-3}$ ohms · cm |

To calculate the efficiency of thermoelectric device 10 using equation (1) above, we must first calculate the figure of merit for thermoelectric device 10 using equation (2) above. This requires calculation of the equivalent Seebeck coefficient ($S_{eq}$), the equivalent electrical resistance ($R_{eq}$), and the equivalent thermal conductance ($K_{eq}$) for a single thermoelectric couple of thermoelectric device 10.

The equivalent Seebeck coefficient for a single thermoelectric couple of thermoelectric device 10 is the difference between the Seebeck coefficient for the p-type semiconductor material and the Seebeck coefficient for the n-type semiconductor material, as shown by the following equation:

$$S_{eq} = S_p - S_n \quad (7)$$

where $S_{eq}$=equivalent Seebeck coefficient for single thermoelectric couple in µV/° K;

$S_p$=Seebeck coefficient for p-type semiconductor material in µV/° K; and $S_n$=Seebeck coefficient for n-type semiconductor material in µV/° K.

Thus, the equivalent Seebeck coefficient for a single thermoelectric couple of thermoelectric device 10 is calculated from equation (7) using the values for the Seebeck coefficient for the p-type semiconductor element ($S_p$) and the Seebeck coefficient for the n-type semiconductor element ($S_n$) shown in Table 1, as follows:

$$S_{eq} = S_p - S_n = 240 \times 10^{-6} - (-184 \times 10^{-6}) = 424 \ \mu V/° K$$

Next, because n-type semiconductor element 14 and p-type semiconductor element 16 and are electrically connected in series, the equivalent electrical resistance for a single thermoelectric couple of thermoelectric device 10 is the sum of the electrical resistance for p-type semiconductor element 16 and the electrical resistance for n-type semiconductor element 14, as shown by the following equation:

$$R_{eq} = R_p + R_n \quad (8)$$

where $R_{eq}$=equivalent electrical resistance for single thermoelectric couple in ohms;

$R_p$=electrical resistance for p-type semiconductor element in ohms; and $R_n$=electrical resistance for n-type semiconductor element in ohms.

The electrical resistance for p-type semiconductor element 16 ($R_p$) is calculated using equation (3) above (using the value for p-type electrical resistivity ($\rho_p$) shown in Table 1 above and the dimensions of p-type semiconductor element 16 set forth above), as follows:

$$R_p = \rho_p \cdot \left(\frac{h_p}{SA_p}\right) = 0.52 \times 10^{-3} \cdot \left(\frac{0.05}{1}\right) = 2.60 \times 10^{-5} \ \Omega$$

The electrical resistance for n-type semiconductor element 14 ($R_n$) is calculated using equation (4) above (using the value for n-type electrical resistivity ($\rho_n$) shown in Table 1 above and the dimensions of n-type semiconductor element 16 set forth above), as follows:

$$R_n = \rho_n \cdot \left(\frac{h_n}{SA_n}\right) = 0.63 \times 10^{-3} \cdot \left(\frac{0.05}{1}\right) = 3.15 \times 10^{-5} \ \Omega$$

Thus, the equivalent electrical resistance ($R_{eq}$) for a single thermoelectric couple of thermoelectric device 10 is calculated using equation (8) above, as follows:

$$R_{eq} = R_p + R_n = 2.6 \times 10^{-5} + 3.15 \times 10^{-5} = 5.75 \times 10^{-5} \ \Omega$$

Next, because p-type semiconductor element 16 and n-type semiconductor element 14 are thermally connected in parallel, the equivalent thermal conductance for a single thermoelectric couple of thermoelectric device 10 is the sum of the thermal conductance for p-type semiconductor element 16 and the thermal conductance for n-type semiconductor element 14, as shown by the following equation:

$$K_{eq} = K_p + K_n \quad (9)$$

where $K_{eq}$=the equivalent thermal conductance for a single thermoelectric couple in W/° K;

$K_p$=the thermal conductance for the p-type semiconductor element in W/° K; and $K_n$=the thermal conductance for the n-type semiconductor element in W/° K.

The thermal conductance for p-type semiconductor element 16 ($K_p$) is calculated using equation (5) above (using the value for p-type thermal conductivity ($k_p$) shown in Table 1 above and the dimensions of p-type semiconductor element 16 set forth above), as follows:

$$K_p = k_p \cdot \left(\frac{SA_p}{h_p}\right) = 0.02 \cdot \left(\frac{1}{0.05}\right) = 0.40 \ \frac{W}{° K}$$

The thermal conductance for n-type semiconductor element 14 ($K_n$) is calculated using equation (6) above (using the value for n-type thermal conductivity ($k_n$) shown in Table 1 above and the dimensions of n-type semiconductor element 14 set forth above), as follows:

$$K_n = k_n \cdot \left(\frac{SA_n}{h_n}\right) = 0.26 \cdot \left(\frac{1}{0.05}\right) = 0.512 \ \frac{W}{° K}$$

Thus, the equivalent thermal conductance ($K_{eq}$) for a single thermoelectric couple of thermoelectric device 10 is calculated using equation (9) above, as follows:

$$K_{eq} = K_p + K_n = 0.4 + 0.512 = 0.912 \ W/° K$$

As a result, the figure of merit for thermoelectric device 10 is calculated using equation (2) above, as follows:

$$Z = \frac{S_{eq}^2}{R_{eq} \cdot K_{eq}} = \frac{(424 \times 10^{-6})^2}{(5.75 \times 10^{-5}) \cdot (0.912)} = 3.43 \times 10^{-3} \ \frac{1}{° K}$$

For purposes of comparison, we will calculate the efficiency of thermoelectric device 10 at six different temperatures for top plate 20 (i.e., the "hot" plate): 373° K, 473° K, 573° K, 673° K, 773° K and 873° K. For each of these temperatures, we will assume a temperature of 273° K on bottom plate 22 (i.e., the "cold" plate).

Assuming a temperature of 373° K on top plate 20 ($T_h$=373° K) and a temperature of 273° K on bottom plate 22 ($T_c$=273° K), the temperature difference between the plates is calculated as follows:

$$\Delta T = T_h - T_c = 373 - 273 = 100°\ K$$

The efficiency of thermoelectric device 10 can be calculated using equation (1) above, as follows:

$$\eta = \frac{\Delta T}{2T_h - \frac{\Delta T}{2} + \frac{4}{Z}} = \frac{100}{2 \cdot (373) - \frac{100}{2} + \frac{4}{3.43 \times 10^{-3}}} = 0.0537 = 5.37\%$$

Thus, thermoelectric device 10 has an efficiency of 5.37% in the example where the device uses the semiconductor materials shown in Table 1 above and there is a temperature difference of 100° K between top plate 20 and bottom plate 22. In other words, thermoelectric device 10 is only utilizing 5.37% of the energy absorbed by top plate 20.

Assuming a temperature of 473° K on top plate 20 ($T_h$=473° K) and a temperature of 273° K on bottom plate 22 ($T_c$=273° K), the temperature difference between the plates is calculated as follows:

$$\Delta T = T_h - T_c = 473 - 273 = 200°\ K$$

The efficiency of thermoelectric device 10 can be calculated using equation (1) above, as follows:

$$\eta = \frac{\Delta T}{2T_h - \frac{\Delta T}{2} + \frac{4}{Z}} = \frac{200}{2 \cdot (473) - \frac{200}{2} + \frac{4}{3.43 \times 10^{-3}}} = 0.0994 = 9.94\%$$

Thus, thermoelectric device 10 has an efficiency of 9.94% in the example where the device uses the semiconductor materials shown in Table 1 above and there is a temperature difference of 200° K between top plate 20 and bottom plate 22. In other words, thermoelectric device 10 is only utilizing 9.94% of the energy absorbed by top plate 20.

Now, assuming a temperature of 573° K on top plate 20 ($T_h$=573° K) and a temperature of 273° K on bottom plate 22 ($T_c$=273° K), the temperature difference between the plates is calculated as follows:

$$\Delta T = T_h - T_c = 573 - 273 = 300°\ K$$

The efficiency of thermoelectric device 10 can be calculated using equation (1) above, as follows:

$$\eta = \frac{\Delta T}{2T_h - \frac{\Delta T}{2} + \frac{4}{Z}} = \frac{300}{2 \cdot (573) - \frac{300}{2} + \frac{4}{3.43 \times 10^{-3}}} = 0.139 = 13.9\%$$

Thus, thermoelectric device 10 has an efficiency of 13.9% in the example where the device uses the semiconductor materials shown in Table 1 above and there is a temperature difference of 300° K between top plate 20 and bottom plate 22. In other words, thermoelectric device 10 is only utilizing 13.9% of the energy absorbed by top plate 20.

Using the methodology and equations of the examples set forth above, the efficiency of thermoelectric device 10 is calculated as 17.3% in an example where the temperature of top plate 20 is 673° K and the temperature of bottom plate 22 is 273° K. Also, the efficiency of thermoelectric device 10 is calculated as 20.3% in an example where the temperature of top plate 20 is 773° K and the temperature of bottom plate 22 is 273° K. In addition, the efficiency of thermoelectric device 10 is calculated as 23.0% in an example where the temperature of top plate 20 is 873° K and the temperature of bottom plate 22 is 273° K. Of course, one skilled in the art will understand that the efficiency of thermoelectric device 10 may be calculated for any combination of values for the temperatures of top and bottom plates 20, 22.

Thermoelectric Device 110 (Example 1)

As discussed above, thermoelectric device 110 is comprised of n-type semiconductor elements 114a, 114b connected by electrical conductor 114c and p-type semiconductor elements 116a, 116b connected by electrical conductor 116c. For purposes of this example, we will assume that n-type semiconductor elements 114a, 114b are made of $Bi_2S_3$ (sintered), p-type semiconductor elements 116a, 116b are made of $Bi_2Te_3$ (i.e. the same material as p-type semiconductor elements 16 of thermoelectric device 10), and electrical conductors 114c, 116c are made of 23 AWG copper wire. We will also assume that semiconductor elements 114a, 114b, 116a, 116b each have a length of 1 cm, a width of 1 cm, and a height of 0.05 cm (i.e., the same dimensions as semiconductor elements 14, 16 of thermoelectric device 10), and that electrical conductors 114c, 116c each have a length of 2.54 cm. Table 2 is provided below to show the various properties for these semiconductor materials and electrical conductors, namely, the Seebeck coefficient (S), the thermal conductivity (k), and the electrical resistivity (ρ) for each material. These values will be used below to perform various calculations relating to the efficiency of thermoelectric device 110.

TABLE 2

|  | n-type semiconductor element ($Bi_2S_3$ (sintered)) | p-type semiconductor element ($Bi_2Te_3$) | electrical conductor (Cu) |
|---|---|---|---|
| Seebeck coefficient (S) | $-1300 \times 10^{-6}$ V/° K | $240 \times 10^{-6}$ V/° K | n/a |
| thermal conductivity (k) | 0.206 W/(cm · ° K) | 0.02 W/(cm · ° K) | 4.01 W/(cm · ° K) |
| electrical resistivity (ρ) | $1.0 \times 10^{-3}$ ohms · cm | $0.52 \times 10^{-3}$ ohms · cm | $16.78 \times 10^{-7}$ ohms · cm |

To calculate the efficiency of thermoelectric device 110 using equation (1) above, we must first calculate the figure of merit for thermoelectric device 110 using equation (2) above. This requires calculation of the equivalent Seebeck coefficient ($S_{eq}$), the equivalent electrical resistance ($R_{eq}$), and the equivalent thermal conductance ($K_{eq}$) for a single thermoelectric couple of thermoelectric device 110.

Like thermoelectric device 10, the equivalent Seebeck coefficient for a single couple of thermoelectric device 110 is the difference between the Seebeck coefficient for the p-type semiconductor material and the Seebeck coefficient for the n-type semiconductor material, as shown by equation (7) above. Thus, the equivalent Seebeck coefficient for a single thermoelectric couple of thermoelectric device 110 is calculated from equation (7) using the values for the Seebeck coefficient for the p-type semiconductor element ($S_p$) and the Seebeck coefficient for the n-type semiconductor element ($S_n$) shown in Table 2, as follows:

$$S_{eq}=S_p-S_n=240\times10^{-6}-(-1300\times10^{-6})= 1540\times10^{-6} \text{ V/}^\circ \text{K}$$

Next, because n-type semiconductor elements 114a, 114b, p-type semiconductor elements 116a, 116b, and electrical conductors 114c, 116c are electrically connected in series, the equivalent electrical resistance for a single thermoelectric couple of thermoelectric device 110 is the sum of the electrical resistances for each of n-type semiconductor elements 114a, 114b, p-type semiconductor elements 116a, 116b, and electrical conductors 114c, 116c, as shown by the following equation:

$$R_{eq}=2R_n+2R_p+2R_c \qquad (10)$$

where $R_{eq}$=equivalent electrical resistance for single thermoelectric couple in ohms;

$R_p$=electrical resistance for each p-type semiconductor element in ohms;

$R_p$=electrical resistance for each n-type semiconductor element in ohms; and $R_c$=electrical resistance for each electrical conductor in ohms.

The electrical resistance for each of p-type semiconductor elements 116a, 116b ($R_p$) is calculated using equation (3) above (using the value for p-type electrical resistivity ($\rho_p$) shown in Table 2 above and the dimensions of each of p-type semiconductor elements 116a, 116b set forth above), as follows:

$$R_p = \rho_p \cdot \left(\frac{h_p}{SA_p}\right) = 0.52\times10^{-3} \cdot \left(\frac{0.05}{1}\right) = 2.60\times10^{-5} \Omega$$

The electrical resistance for each of n-type semiconductor elements 114a, 114b ($R_n$) is calculated using equation (4) above (using the value for n-type electrical resistivity ($\rho_n$) shown in Table 2 above and the dimensions of each of n-type semiconductor elements 114a, 114b set forth above), as follows:

$$R_n = \rho_n \cdot \left(\frac{h_n}{SA_n}\right) = 1.00\times10^{-3} \cdot \left(\frac{0.05}{1}\right) = 5.00\times10^{-5} \Omega$$

The electrical resistance for each of electrical conductors 114c, 116c is dependent on the electrical resistivity of the material used to construct each conductor and the dimensions of each conductor, as shown by the following equation:

$$R_c = \rho_c \cdot \left(\frac{h_c}{SA_c}\right) \qquad (11)$$

where $R_c$=electrical resistance for each electrical conductor in ohms;

$\rho_c$=electrical resistivity of material used for each electrical conductor in ohms·cm;

$h_c$=length of each electrical conductor in cm; and $SA_c$=cross-sectional surface area of each electrical conductor in cm$^2$.

The electrical resistance for each of electrical conductors 114c, 116c is calculated using equation (11) above (using the value for electrical resistivity ($\rho_c$) shown in Table 2 above and the dimensions of each of electrical conductors 114c, 116c set forth above, wherein the surface area of 23 AWG copper wire is known to be $2.60\times10^{-3}$ cm$^2$), as follows:

$$R_c = \rho_c \cdot \left(\frac{h_c}{SA_c}\right) = 16.78\times10^{-7} \cdot \left(\frac{2.54}{2.60\times10^{-3}}\right) = 1.64\times10^{-3} \Omega$$

Thus, the equivalent electrical resistance ($R_{eq}$) for a single thermoelectric couple of thermoelectric device 110 is calculated using equation (10) above, as follows:

$$\begin{aligned} R_{eq} &= 2R_n + 2R_p + 2R_c \\ &= 2\cdot(5.00\times10^{-5}) + 2\cdot(2.60\times10^{-5}) + 2\cdot(1.64\times10^{-3}) \\ &= 3.43\times10^{-3} \Omega \end{aligned}$$

Next, because p-type element assembly 116 and n-type element assembly 114 are thermally connected in parallel, the equivalent thermal conductance for a single thermoelectric couple of thermoelectric device 110 is the sum of the equivalent thermal conductance for p-type element assembly 116 and the equivalent thermal conductance for n-type element assembly 114, as shown by the following equation:

$$K_{eq}=K_{peq}+K_{neq} \qquad (12)$$

where $K_{eq}$=equivalent thermal conductance for single thermoelectric couple in W/$^\circ$ K;

$K_{peq}$=equivalent thermal conductance for p-type element assembly in W/$^\circ$ K; and $K_{neq}$=equivalent thermal conductance for n-type element assembly in W/$^\circ$ K.

Because p-type semiconductor elements 116a, 116b and electrical conductor 116c are thermally connected in series, the equivalent thermal conductance for p-type element assembly 116 can be calculated from the equation below:

$$K_{peq} = \frac{K_p K_c}{K_p + 2K_c} \qquad (13)$$

where $K_{peq}$=equivalent thermal conductance for p-type element assembly in W/$^\circ$ K;

$K_p$=thermal conductance for each p-type semiconductor element in W/$^\circ$ K; and $K_c$=thermal conductance for electrical conductor in W/$^\circ$ K.

The thermal conductance for each of p-type semiconductor elements 116a, 116b ($K_p$) is calculated using equation (5) above (using the value for p-type thermal conductivity ($k_p$) shown in Table 2 above and the dimensions of each of p-type semiconductor elements 116a, 116b set forth above), as follows:

$$K_p = k_p \cdot \left(\frac{SA_p}{h_p}\right) = 0.02 \cdot \left(\frac{1}{0.05}\right) = 0.40 \frac{W}{°K}$$

The thermal conductance for an electrical conductor is dependent on the thermal conductivity of the material used to construct the conductor and the dimensions of the conductor, as shown by the following equation:

$$K_c = k_c \cdot \left(\frac{SA_c}{h_c}\right) \quad (14)$$

where $K_c$=thermal conductance for electrical conductor in W/° K;

$K_c$=thermal conductivity of material used for electrical conductor in W/cm·° K;

$SA_c$=cross-sectional surface area of electrical conductor in cm$^2$; and $h_c$=length of electrical conductor in cm.

The thermal conductance for electrical conductor 116c ($K_c$) is calculated using equation (14) above (using the value for thermal conductivity ($k_c$) shown in Table 2 above and the dimensions of electrical conductor 116c set forth above, wherein the surface area of 23 AWG copper wire is known to be 2.60×10$^{-3}$ cm$^2$), as follows:

$$K_c = k_c \cdot \left(\frac{SA_c}{h_c}\right) = 4.01 \cdot \left(\frac{2.60 \times 10^{-3}}{2.54}\right) = 4.11 \times 10^{-3} \frac{W}{°K}$$

Thus, the equivalent thermal conductance for p-type element assembly 116 ($K_{peq}$) is calculated using equation (13) above, as follows:

$$K_{peq} = \frac{K_p K_c}{K_p + 2K_c} = \frac{(0.40) \cdot 4.11 \times 10^{-3}}{(0.40) + 2 \cdot (4.11 \times 10^{-3})} = 4.02 \times 10^{-3} \frac{W}{°K}$$

Similarly, because n-type semiconductor elements 114a, 114b and electrical conductor 114c are thermally connected in series, the equivalent thermal conductance for n-type element assembly 114 can be calculated from the equation below:

$$K_{neq} = \frac{K_n K_c}{K_n + 2K_c} \quad (15)$$

where $K_{neq}$=equivalent thermal conductance for n-type element assembly in W/° K;

$K_n$=thermal conductance for each n-type semiconductor element in W/° K; and $K_c$=thermal conductance for electrical conductor in W/° K.

The thermal conductance for each of n-type semiconductor elements 114a, 114b ($K_n$) is calculated using equation (6) above (using the value for n-type thermal conductivity ($k_n$) shown in Table 2 above and the dimensions of each of n-type semiconductor elements 114a, 114b set forth above), as follows:

$$K_n = k_n \cdot \left(\frac{SA_n}{h_n}\right) = 0.206 \cdot \left(\frac{1}{0.05}\right) = 4.12 \frac{W}{°K}$$

The thermal conductance for electrical conductor 114c ($K_c$) is calculated using equation (14) above (using the value for thermal conductivity ($k_c$) shown in Table 2 above and the dimensions of electrical conductor 114c set forth above, wherein the surface area of 23 AWG copper wire is known to be 2.60×10$^{-3}$ cm$^2$), as follows:

$$K_c = k_c \cdot \left(\frac{SA_c}{h_c}\right) = 4.01 \cdot \left(\frac{2.60 \times 10^{-3}}{2.54}\right) = 4.11 \times 10^{-3} \frac{W}{°K}$$

Thus, the equivalent thermal conductance for n-type element assembly 114 ($K_{neq}$) is calculated using equation (13) above, as follows:

$$K_{neq} = \frac{K_n K_c}{K_n + 2K_c} = \frac{(4.12) \cdot 4.11 \times 10^{-3}}{(4.12) + 2 \cdot (4.11 \times 10^{-3})} = 4.10 \times 10^{-3} \frac{W}{°K}$$

The equivalent thermal conductance for a single thermoelectric couple of thermoelectric device 110 ($K_{eq}$) is then calculated using equation (12) above, as follows:

$$K_{eq} = K_{peq} + K_{neq} = 4.02 \times 10^{-3} + 4.10 \times 10^{-3} = 8.12 \times 10^{-3} \text{ W/° K}$$

As a result, the figure of merit for thermoelectric device 110 is calculated using equation (2) above, as follows:

$$Z = \frac{S_{eq}^2}{R_{eq} \cdot K_{eq}} = \frac{(1540 \times 10^{-6})^2}{(3.43 \times 10^{-3}) \cdot (8.12 \times 10^{-3})} = 85.2 \times 10^{-3} \frac{1}{°K}$$

For purposes of comparison, we will calculate the efficiency of thermoelectric device 110 at three different temperatures for top plate 120 (i.e., the "hot" plate): 373° K, 473° K, and 573° K. For each of these temperatures, we will assume a temperature of 273° K on bottom plate 122 (i.e., the "cold" plate). It should be noted that these same temperatures were used in the calculations for thermoelectric device 10 above.

Assuming a temperature of 373° K on top plate 120 ($T_h$=373° K) and a temperature of 273° K on bottom plate 122 ($T_c$=273° K), the temperature difference between the plates is calculated as follows:

$$\Delta T = T_h - T_c = 373 - 273 = 100° \text{ K}$$

The efficiency of thermoelectric device 110 can be calculated using equation (1) above, as follows:

$$\eta = \frac{\Delta T}{2T_h - \frac{\Delta T}{2} + \frac{4}{Z}} = \frac{100}{2 \cdot (373) - \frac{100}{2} + \frac{4}{85.2 \times 10^{-3}}} = 0.135 = 13.5\%$$

Thus, thermoelectric device 110 has an efficiency of 13.5% in the example where the device uses the semiconductor materials shown in Table 2 above and there is a temperature difference of 100° K between top plate 120 and bottom plate 122. In other words, thermoelectric device 110 is utilizing 13.5% of the energy absorbed by top plate 120.

Assuming a temperature of 473° K on top plate 120 ($T_h$=473° K) and a temperature of 273° K on bottom plate 122 ($T_c$=273° K), the temperature difference between the plates is calculated as follows:

$$\Delta T = T_h - T_c = 473 - 273 = 200° \text{ K}$$

The efficiency of thermoelectric device 110 can be calculated using equation (1) above, as follows:

$$\eta = \frac{\Delta T}{2T_h - \frac{\Delta T}{2} + \frac{4}{Z}} = \frac{200}{2 \cdot (473) - \frac{200}{2} + \frac{4}{85.2 \times 10^{-3}}} = 0.224 = 22.4\%$$

Thus, thermoelectric device 110 has an efficiency of 22.4% in the example where the device uses the semiconductor materials shown in Table 2 above and there is a temperature difference of 200° K between top plate 120 and bottom plate 122. In other words, thermoelectric device 110 is utilizing 22.4% of the energy absorbed by top plate 120.

Now, assuming a temperature of 573° K on top plate 120 ($T_h$=573° K) and a temperature of 273° K on bottom plate 122 ($T_c$=273° K), the temperature difference between the plates is calculated as follows:

$$\Delta T = T_h - T_c = 573 - 273 = 300° \text{ K}$$

The efficiency of thermoelectric device 110 can be calculated using equation (1) above, as follows:

$$\eta = \frac{\Delta T}{2T_h - \frac{\Delta T}{2} + \frac{4}{Z}} = \frac{300}{2 \cdot (573) - \frac{300}{2} + \frac{4}{85.2 \times 10^{-3}}} = 0.288 = 28.8\%$$

Thus, thermoelectric device 110 has an efficiency of 28.8% in the example where the device uses the semiconductor materials shown in Table 2 above and there is a temperature difference of 300° K between top plate 120 and bottom plate 122. In other words, thermoelectric device 110 is utilizing 28.8% of the energy absorbed by top plate 120.

Using the methodology and equations of the examples set forth above, the efficiency of thermoelectric device 110 is calculated as 33.5% in an example where the temperature of top plate 120 is 673° K and the temperature of bottom plate 122 is 273° K. Also, the efficiency of thermoelectric device 110 is calculated as 37.2% in an example where the temperature of top plate 120 is 773° K and the temperature of bottom plate 122 is 273° K. In addition, the efficiency of thermoelectric device 110 is calculated as 40.2% in an example where the temperature of top plate 120 is 873° K and the temperature of bottom plate 122 is 273° K. Of course, one skilled in the art will understand that the efficiency of thermoelectric device 110 may be calculated for any combination of values for the temperatures of top and bottom plates 120, 122.

Table 3 is provided below to show a side-by-side comparison of the figure of merit and efficiencies calculated above for conventional thermoelectric device 10 and the exemplary embodiment of thermoelectric device 110.

TABLE 3

|  | Thermoelectric Device 10 | Thermoelectric Device 110 |
| --- | --- | --- |
| Figure of Merit (Z) | 3.43 × 10⁻³ | 85.2 × 10⁻³ |
| Efficiency at ΔT = 100° K | 5.37% | 13.5% |
| Efficiency at ΔT = 200° K | 9.94% | 22.4% |
| Efficiency at ΔT = 300° K | 13.9% | 28.8% |
| Efficiency at ΔT = 400° K | 17.3% | 33.5% |
| Efficiency at ΔT = 500° K | 20.3% | 37.2% |
| Efficiency at ΔT = 600° K | 23.0% | 40.2% |

As can be seen from Table 3, thermoelectric device 110 has a figure of merit that is almost 25 times greater than that of conventional thermoelectric device 10. This dramatic increase in the figure of merit is primarily a result of the use of a semiconductor material for n-type semiconductor elements 114a, 114b ($Bi_2S_3$(sintered)) having a Seebeck coefficient with a negative value that is much larger than that of the semiconductor material used for n-type semiconductor element 14 ($Bi_2Te_3$+0.1% I). It should also be noted that, in this example, even though n-type semiconductor elements 114a, 114b have a significantly larger thermal conductance than that of semiconductor element 14 due to the change of semiconductor material, the equivalent thermal conductance for n-type element assembly 114 is significantly smaller than the thermal conductance of semiconductor element 14 because of the small diameter of electrical conductor 114c.

As can also be seen from Table 3, the efficiency of thermoelectric device 110 is greater than that of conventional thermoelectric device 10. At a temperature difference of 100° K, the efficiency of thermoelectric device 110 (13.5%) is 2.51 times greater than the efficiency of thermoelectric device 10 (5.37%). At a temperature difference of 200° K, the efficiency of thermoelectric device 110 (22.4%) is 2.25 times greater than the efficiency of thermoelectric device 10 (9.94%). At a temperature difference of 300° K, the efficiency of thermoelectric device 110 (28.8%) is 2.07 times greater than the efficiency of thermoelectric device 10 (13.9%). At a temperature difference of 400° K, the efficiency of thermoelectric device 110 (33.5%) is 1.94 times greater than the efficiency of thermoelectric device 10 (17.3%). At a temperature difference of 500° K, the efficiency of thermoelectric device 110 (37.2%) is 1.83 times greater than the efficiency of thermoelectric device 10 (20.3%). At a temperature difference of 600° K, the efficiency of thermoelectric device 110 (40.2%) is 1.75 times greater than the efficiency of thermoelectric device 10 (23.0%). Thus, using a semiconductor material for n-type semiconductor elements 114a, 114b that is not suitable for use in n-type semiconductor element 14 results in efficiencies for thermoelectric device 110 that are 175% to 250% of the efficiencies for conventional thermoelectric device 10.

Of course, it should be understood that the comparison of the efficiency of conventional thermoelectric device 10 to the efficiency of thermoelectric device 110 for a given temperature difference, as set forth in Table 3, does not fully demonstrate the increased efficiencies of thermoelectric device 110. Specifically, under the same operating conditions, the temperature difference between top and bottom plates 120, 122 of thermoelectric device 110 will be greater than the temperature difference between top and bottom plates 20, 22 of conventional thermoelectric device 10 (i.e., the temperature difference will not be the same as shown in Table 3). As such, the increased efficiencies of thermoelectric device 110 are even greater than those shown in Table 3.

The use of a semiconductor material for n-type semiconductor elements 114a, 114b having a Seebeck coefficient with a larger negative value also provides a higher ZT value. For example, the peak ZT value of $Bi_2Te_3$ (i.e., the material for the p-type semiconductor elements used in the above examples) occurs at 400° K. Using 400° K as the mean temperature of the thermoelectric device, the ZT value of conventional thermoelectric device 10 is calculated as 1.372 ($3.43\times10^{-3}$ 1/° K$\times$400° K) and the ZT value of thermoelectric device 110 is 34 ($85.2\times10^{-3}$ 1/° K$\times$400° K). Thus, a thermoelectric device in accordance with the present invention is able to attain ZT values that are significantly higher than those attainable with conventional thermoelectric devices. To illustrate this point, Table 4 is provided below to show a side-by-side comparison of the ZT values for conventional thermoelectric device 10 and the exemplary embodiment of thermoelectric device 110, wherein $\overline{T}$ is the average temperature in degrees Kelvin $$\left(\text{i.e., } \overline{T} = \frac{T_c + T_h}{2}\right)$$

and ZT=Z$\times \overline{T}$.

TABLE 4

| | Average Temperature $\overline{T}$ | Thermoelectric Device 10 | Thermoelectric Device 110 |
|---|---|---|---|
| ZT at ΔT = 100° K | 323° K | 1.11 | 27.52 |
| ZT at ΔT = 200° K | 373° K | 1.28 | 31.78 |
| ZT at ΔT = 300° K | 423° K | 1.45 | 36.04 |
| ZT at ΔT = 400° K | 473° K | 1.62 | 40.3 |
| ZT at ΔT = 500° K | 523° K | 1.79 | 44.56 |
| ZT at ΔT = 600° K | 573° K | 1.97 | 48.82 |

The significant increases in the figure of merit, efficiencies and ZT values of thermoelectric device 110 described above are achieved only by changing the material used for n-type semiconductor elements 114a, 114b. One skilled in the art will appreciate that these increases can be even greater by using a semiconductor material for p-type semiconductor elements 116a, 116b having a Seebeck coefficient with a larger positive value, provided the electrical resistivity of the material is not too high (as discussed above). Thus, the thermoelectric device of the present invention may include any combination of n-type and p-type semiconductor materials that result in an increase in the figure of merit and resultant efficiencies of the thermoelectric device in accordance with the teachings of the present invention.

Another way of demonstrating the increased efficiencies of thermoelectric device 110 in relation to those of conventional thermoelectric device 10 is to compare the change in temperature between the top and bottom plates (ΔT) that is needed to generate a fixed amount of power with a fixed amount of current through a single thermoelectric couple. The change in temperate between the top and bottom plates can be calculated from the following equation:

$$\Delta T = \frac{P - I^2 R_{eq}}{S_{eq} I} \quad (16)$$

where

ΔT=temperature difference between top and bottom plates in ° K;

P=power generated in single thermoelectric couple in W;

I=current through single thermoelectric couple in amps;

$R_{eq}$=equivalent electrical resistance of single thermoelectric couple in ohms; and $S_{eq}$=equivalent Seebeck coefficient of single thermoelectric couple in V/° K.

For purposes of comparison, we will assume the following: (1) conventional thermoelectric device 10 is constructed with the same materials and dimensions for n-type semiconductor elements 14 and p-type semiconductor elements 16 as those described above (see Table 1) and, as such, the values for the equivalent Seebeck coefficient and equivalent electrical resistance are the same as those calculated above; (2) thermoelectric device 110 is constructed with the same materials and dimensions for n-type semiconductor elements 114a, 114b, p-type semiconductor elements 116a, 116b and electrical conductors 114c, 116c as those described in example 1 above (see Table 2) and, as such, the values for the equivalent Seebeck coefficient and equivalent electrical resistance are the same as those calculated in example 1 above; (3) the amount of power to be generated in a single thermoelectric couple of each device is 0.5 W; and (4) each device is designed to carry 10 amps of current.

The change in temperate between top and bottom plates 20, 22 of conventional thermoelectric device 10 can be calculated using equation (16), as follows:

$$\Delta T = \frac{P - I^2 R_{eq}}{S_{eq} I} = \frac{0.5 - (10^2)(5.75\times10^{-5})}{(0.424\times10^{-3})(10)} = 116.57°K$$

Thus, there must be a temperature difference of 116.57° K between top and bottom plates 20, 22 to obtain 0.5 watts of power per thermoelectric couple.

In comparison, the change in temperate between top and bottom plates 120, 122 of thermoelectric device 110 can be calculated using equation (16), as follows:

$$\Delta T = \frac{P - I^2 R_{eq}}{S_{eq} I} = \frac{0.5 - (10^2)(0.00343)}{(0.00154)(10)} = 10.19°K$$

Thus, there must be a temperature difference of 10.19° K between top and bottom plates 120, 122 to obtain 0.5 watts of power per thermoelectric couple. From this comparison, one skilled in the art will appreciate that the power generated in thermoelectric device 110 will be far greater than the power generated in conventional thermoelectric device 10 for the same temperature difference between the top and bottom plates.

As discussed above, the semiconductor materials used in thermoelectric device 110 cannot be used in conventional thermoelectric device 10 because of the high thermal conductivity of the material used for n-type semiconductor elements 114a, 114b (the same rationale would also apply if a material having a Seebeck coefficient with a larger positive value were used for p-type semiconductor elements 116a, 116b). Another reason that the semiconductor materials used in the thermoelectric device of present invention cannot be used in conventional thermoelectric device 10 is because the use of such materials would generate currents that are too high for the device. The current through a thermoelectric device is represented by the following equation:

$$I = \frac{S_{eq} \cdot \Delta T}{2 \cdot R_{eq}} \quad (17)$$

where
- I=current through single thermoelectric couple in amps;
- $S_{eq}$=equivalent Seebeck coefficient of single thermoelectric couple in V/° K;
- ΔT=temperature difference between top and bottom plates in ° K; and
- $R_{eq}$=equivalent electrical resistance of single thermoelectric couple in ohms.

For purposes of comparison, we will assume that conventional thermoelectric device 10 is made of the same semiconductor materials used in the above example for thermoelectric device 110. Table 5 below compares the current generated by conventional thermoelectric device 10 with the current generated by thermoelectric device 110 at three different temperatures for top plates 20, 120, i.e., 373° K, 473° K, and 573° K, wherein it is assumed that the temperature of bottom plates 22, 122 is 273° K.

TABLE 5

|  | Thermoelectric Device 10 | Thermoelectric Device 110 |
|---|---|---|
| Current (I) at ΔT = 100° K | 1013 A | 22.4 A |
| Current (I) at ΔT = 200° K | 2026 A | 44.9 A |
| Current (I) at ΔT = 300° K | 3039 A | 67.3 A |

As can be seen from Table 5, thermoelectric device 10 would theoretically generate a current that is far greater than the current generated by thermoelectric device 110. Such high current levels are not realistic or physically possible and, in fact, would cause failure of the device. In practice, the current levels of thermoelectric device 10 would never reach unacceptable levels because the temperature difference between top and bottom plates 20, 22 (ΔT) would never get high enough to reach such high current levels due to the thermal conductivity of the chosen semiconductor materials. The current levels shown in Table 5 for thermoelectric device 110 are too high, but can be lowered to acceptable levels by adjusting the size of the semiconductor elements, adjusting the distance between element assemblies and/or adjusting the length of the electrical conductors connecting the semiconductor elements (as described herein). It is also possible to change the gauge of the electrical conductors so as to enable higher current levels, but this approach is not preferred insofar as a larger diameter gauge will reduce the efficiency of thermoelectric device 110.

B. Change in Spacing Between Element Assemblies

In another aspect of the invention, thermoelectric device 110 as shown in FIG. 2 is configured such that the distance d1 between n-type element assembly 114 and p-type element assembly 116 is increased relative to the typical distance d between n-type semiconductor element 14 and p-type semiconductor element 16 of conventional thermoelectric device 10 shown in FIG. 1. As discussed below, increasing the distance d1 between element assemblies 114, 116 improves the efficiency of thermoelectric device 110 and, in addition, reduces the cost of manufacturing because fewer element assemblies are required for the device. Of course, it should be understood that the use of fewer element assemblies also reduces the overall power generated per area. As such, if too few element assemblies are used, there would not be enough power to justify the cost of the materials. Thus, there is a balance between the number of element assemblies that are used, the efficiency, the cost of the materials, and the overall power output.

Thermoelectric Device 110 (Example 2)

To show the effect of increasing the distance d1 between element assemblies 114, 116 on the efficiency of thermoelectric device 110, an example is provided below in which we calculate the temperature difference between top plate 120 and bottom plate 122 for various numbers of thermoelectric couples in a fixed area (which will be referred to as a thermoelectric module). The change in temperature between top plate 120 and bottom plate 122 can be calculated from the following equation:

$$\Delta T = \frac{-\frac{S_m^2 T_c}{2R_m} - K_m + \sqrt{\left(\frac{S_m^2 T_c}{2R_m} + K_m\right)^2 + 4\left(\frac{3S_m^2}{8R_m}\right)Q_{in}}}{\frac{3S_m^2}{4R_m}} \quad (18)$$

where
- ΔT=temperature difference between top and bottom plates in ° K;
- $T_c$=temperature of bottom plate in ° K;
- $S_m$=Seebeck coefficient for module in V/° K ($S_m=S_{eq}$ n, where $S_{eq}$=equivalent Seebeck coefficient for a single thermoelectric couple in V/° K and n=number of thermoelectric couples);
- $R_m$=electrical resistance for module in ohms ($R_m=S_{eq}$ n, where $S_{eq}$=equivalent electrical resistance for a single thermoelectric couple in ohms and n=number of thermoelectric couples);
- $K_m$=thermal conductance for module in W/° K ($K_m=K_{eq}$ n, where $K_{eq}$=equivalent thermal conductance for a single thermoelectric couple in W/° K and n=number of thermoelectric couples); and
- $Q_{in}$=average power from heat source (e.g., the sun) in W.

For purposes of this example, we will assume the following: (1) the thermoelectric module is constructed with the same materials and dimensions for n-type semiconductor elements 114a, 114b, p-type semiconductor elements 116a, 116b, and electrical conductors 114c, 116c as those described in example 1 above and, as such, the values for the equivalent Seebeck coefficient, equivalent electrical resistance, and equivalent thermal conductance for a single thermoelectric couple are the same as those calculated in example 1 above; (2) the distance d2 between thermoelectric couples is the same as the distance d1 between element assembles 114, 116 (i.e., d1=d2); (3) the thermoelectric module has a length of approximately 30.5 cm and a width of approximately 30.5 cm, i.e., an area $A_m$ of approximately 1 ft²; (4) the average power input ($Q_{in}$) is 100 watts (i.e., the average energy from the sun (100 W/ft²)×$A_m$); and (5) the temperature on bottom plate 122 is 300° K.

The number of thermoelectric couples (n) that can be placed in an area $A_m$ of approximately 1 ft² is dependent on the distance d1 between element assemblies 114, 116 (which, as mentioned above, is the same as the distance d2 between thermoelectric couples in this example). We will assume that the thermoelectric couples are arranged in a square grid pattern for purposes of this example such that the thermoelectric module has the same number of element assemblies along its length and width. Of course, one skilled in the art will understand that other module shapes and patterns of element assemblies 114, 116 are within the scope of the present invention.

In this example, if a thermoelectric module has 392 thermoelectric couples (i.e., 28 element assemblies by 28 element assemblies) within the 1 ft² area of the module, there would be approximately 0.09 cm between adjacent element assemblies (which is in the range of the typical distance between semiconductor elements 14, 16 of conventional thermoelectric device 10). If a thermoelectric module has 98 thermoelectric couples (i.e., 14 element assemblies by 14 element assemblies) within the 1 ft² area of the module, there would be approximately 1.19 cm between adjacent element assemblies. If a thermoelectric module has 18 thermoelectric couples (i.e., 6 element assemblies by 6 element assemblies) within the 1 ft² area of the module, there would be approximately 4.08 cm between adjacent element assemblies. If a thermoelectric module has 8 thermoelectric couples (i.e., 4 element assemblies by 4 element assemblies) within the 1 ft² area of the module, there would be approximately 6.63 cm between adjacent element assemblies. If a thermoelectric module has 2 thermoelectric couples (i.e., 2 element assemblies by 2 element assemblies) within the 1 ft² area of the module, there would be approximately 14.25 cm between adjacent element assemblies.

For each number of thermoelectric couples in the 1 ft² area of the thermoelectric module (i.e., 392 thermoelectric couples, 98 thermoelectric couples, 18 thermoelectric couples, 8 thermoelectric couples, and 2 thermoelectric couples), we can use equation (18) above to calculate the temperature difference ($\Delta T$) between top plate 120 and bottom plate 122 of the thermoelectric module, as shown in Table 6 below.

TABLE 6

| Number of thermo-electric couples (n) per 1 ft² area | Approximate distance between element assemblies (d1 = d2) | Temperature Difference ($\Delta T$) |
|---|---|---|
| 392 | 0.09 cm | $\Delta T$ = 2.3° K |
| 98 | 1.19 cm | $\Delta T$ = 9.0° K |
| 18 | 4.08 cm | $\Delta T$ = 45.0° K |
| 8 | 6.63 cm | $\Delta T$ = 92.3° K |
| 2 | 14.25 cm | $\Delta T$ = 273.9° K |

Using the $\Delta T$ values shown in Table 6, we can use equation (1) above to calculate the efficiency of the thermoelectric module for each number of thermoelectric couples in the device, as shown in Table 7 below (wherein the temperature on top plate 120 ($T_h$) is calculated by adding the temperature of bottom plate 122 (300° K) to the calculated temperature difference shown in Table 6).

TABLE 7

| Number of thermo-electric couples (n) per 1 ft² area | 392 | 98 | 18 | 8 | 2 |
|---|---|---|---|---|---|
| Approximate distance between element assemblies (d1/d2) | 0.09 cm | 1.19 cm | 4.08 cm | 6.63 cm | 14.25 cm |
| Efficiency | 0.35% | 1.37% | 6.30% | 11.75% | 25.89% |

Thus, by increasing the distance between element assemblies 114, 116, the efficiency of the thermoelectric module will significantly increase.

Of course, it should be understood that the efficiency values shown in Table 7 were calculated based on use of a 23 AWG copper wire for each of electrical conductors 114c, 116c without regard to whether a 23 AWG copper wire can physically carry the current that would be generated by the thermoelectric module. Table 8 below shows the current generated by the thermoelectric module in each example.

TABLE 8

| Number of thermoelectric couples (n) per 1 ft² area | 392 | 98 | 18 | 8 | 2 |
|---|---|---|---|---|---|
| Approximate distance between element assemblies (d1/d2) | 0.09 cm | 1.19 cm | 4.08 cm | 6.63 cm | 14.25 cm |
| Efficiency (23 AWG copper wire) | 0.35% | 1.37% | 6.30% | 11.75% | 25.89% |
| Current (I) with 23 AWG copper wire | 0.51 A | 2.03 A | 10.09 A | 20.72 A | 61.47 A |

While the current for the example with 392 thermoelectric couples is within acceptable levels for 23 AWG copper wire, the current for the other examples is too high. The current for these examples can be lowered to acceptable levels by adjusting the size of the semiconductor elements and/or adjusting the length of the electrical conductors connecting the semiconductor elements. It is also possible to change the gauge of the electrical conductors so as to enable higher current levels, but this approach is not preferred insofar as a larger diameter gauge will reduce the efficiency of the thermoelectric module.

As the distance between element assemblies 114, 116 increases (which increases the efficiency of the thermoelectric module), the overall voltage and power produced by the thermoelectric module decreases because there are fewer thermoelectric couples contributing to the power generation. Thus, in certain applications, it may be desirable to use multiple modules connected in series or in parallel in order to achieve a desired amount of total power output, or, to use any combination of modules in series and parallel. One skilled in the art will understand that when a module is connected in series with another module, the voltage increases while the current remains the same. When a module is connected in parallel with another module, the current increases while the voltage remains the same. Because power is equal to voltage times current, the power increases by the same amount no matter how the modules are connected. Thus, the use of modules connected in series and/or in parallel provides a way to set the voltage and current at desired levels.

Another advantage to increasing the distance between element assemblies 114, 116 is that thermoelectric device 110 is less costly to manufacture. For example, as discussed above, there would be 392 thermoelectric couples within a 1 ft² area of the device when the distance between element assemblies 114, 116 is 0.09 cm. The materials for n-type semiconductor elements 114a, 114b and p-type semiconductor elements 116a, 116b are costly and, thus, each additional thermoelectric couple results in additional cost. As such, a thermoelectric module made with 2, 8, 18, or even 98 thermoelectric couples is significantly less expensive to manufacture than a thermoelectric module made with 392 thermoelectric couples. Of course, the use of fewer thermoelectric couples also reduces the overall power generated per area. As such, if too few thermoelectric couples are used, there would not be enough power to justify the cost of the materials. Thus, there is a balance between the number of thermoelectric couples that are used, the efficiency, the cost of the materials, and the overall power output.

C. Change in Length of Electrical Conductors/Thermal Distance Between Plates In another aspect of the invention, thermoelectric device 110 as shown in FIG. 2 is configured such that the length of electrical conductors 114c, 116c is increased so as to increase the thermal distance between top plate 120 and bottom plate 122. As discussed below, increasing the length of electrical conductors 114c, 116c and the thermal distance between top plate 120 and bottom plate 122 improves the efficiency of thermoelectric device 110.

Thermoelectric Device 110 (Example 3)

To show the effect of increasing the length of electrical conductors 114c, 116c and the thermal distance between top plate 120 and bottom plate 122 on the efficiency of thermoelectric device 110, an example is provided below in which the efficiency is calculated for various conductor lengths in a thermoelectric device or module. For purposes of this example, we will assume the following: (1) the thermoelectric module is constructed with the same materials for n-type semiconductor elements 114a, 114b, p-type semiconductor elements 116a, 116b, and electrical conductors 114c, 116c as those described in example 1 above; (2) n-type semiconductor elements 114a, 114b and p-type semiconductor elements 116a, 116b have the same dimensions as those described in example 1 above; (3) the distance d1 between element assembles 114, 116 and the distance d2 between thermoelectric couples are each 2 cm (i.e., d1=d2=2 cm); (4) the average energy from the sun ($E_h$) is 100 W/ft$^2$, which can be used to calculate $Q_{in}$ (i.e., $Q_{in}=E_h \times A_m$); and (5) the temperature on bottom plate 122 is 300° K.

The equivalent electrical resistance, equivalent thermal conductance, temperature difference, figure of merit, and efficiency are calculated for various lengths of electrical conductors 114c, 116c using equations (10), (12), (17), (1) and (10), respectively, as shown in Table 9.

cause a larger temperature difference between top plate 120 and bottom plate 122 (ΔT). This larger temperature difference results in a higher efficiency for the thermoelectric module. Thus, in the example above, the higher efficiency is a result of the increase in the length of electrical conductors 114c, 116c.

Figure 3:
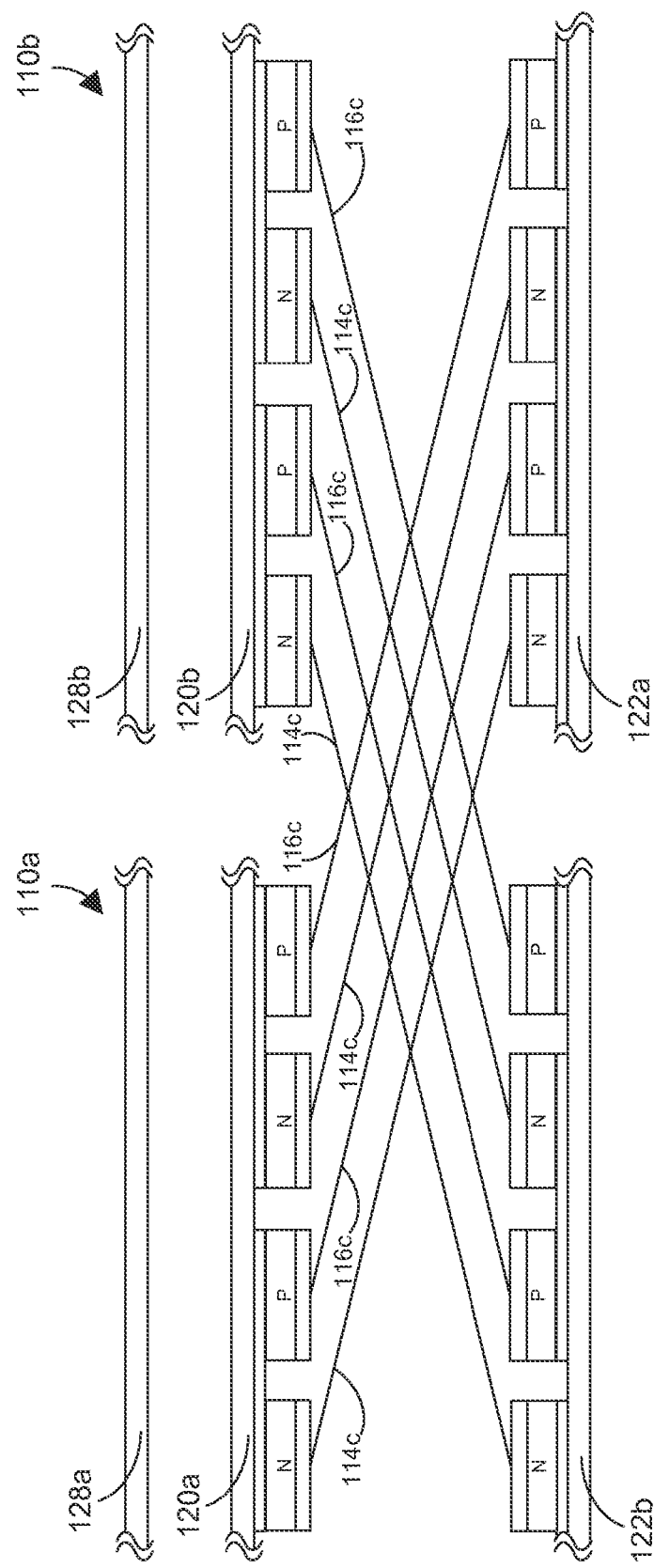
FIG. 3 is a diagram of two thermoelectric devices that have been cross-connected to increase the length of the electrical conductors connecting the various semiconductor elements.

Referring to FIG. 3, an example is provided in which the length of electrical conductors 114c, 116c is increased and the thermal distance between top plate 120 and bottom plate 122 is increased without increasing the space required for the thermoelectric module. FIG. 3 shows a first thermoelectric device 110a and a second thermoelectric device 110b, each of which is identical to thermoelectric device 110 shown in FIG. 2. Although not shown in FIG. 3, thermoelectric devices 110a, 110b each include connection points that enable connection to a load. Thermoelectric devices 110a, 110b could each be connected to a different load, or thermoelectric devices 110a, 110b could be connected to the same load. As can be seen, the thermal distance between top plate 120a and bottom plate 122a and between top plate 120b and bottom plate 122b is greater than the physical distance between the plates.

As shown in FIG. 3, the top semiconductor elements of thermoelectric device 110a are connected to the bottom semiconductor elements of thermoelectric device 110b via electrical conductors 114c (for the n-type elements) and 116c (for the p-type elements), and the top semiconductor elements of thermoelectric device 110b are connected to the bottom semiconductor elements of thermoelectric device 110a via electrical conductors 114c (for the n-type elements) and 116c (for the p-type elements). In this example, electrical conductors 114c, 116c for both thermoelectric devices 110a, 110b have the same gauge and are made of the same material, but could also have different gauges and/or be made of different materials in accordance with the present invention. One skilled in the art will appreciate that the exact increase in the length of electrical conductors 114c, 116c and thermal distance between top plates 120a, 120b and bottom plates 122a, 122b will be dependent on the dimensions of thermoelectric devices 110a, 110b and the distance between thermoelectric device 110a and thermoelectric device 110b.

TABLE 9

| Length of Conductor ($h_c$) | Equivalent Electrical Resistance ($R_{eq}$) | Equivalent Thermal Conductance ($K_{eq}$) | ΔT | Figure of Merit (Z) | Efficiency |
|---|---|---|---|---|---|
| 2.54 cm | 3.4 × 10$^{-3}$ Ω | 8.12 × 10$^{-3}$ W/° K | 16.7° K | 85.2 × 10$^{-3}$ | 2.5% |
| 9 cm | 11.8 × 10$^{-3}$ Ω | 2.31 × 10$^{-3}$ W/° K | 53.02° K | 87.2 × 10$^{-3}$ | 7.3% |
| 30.5 cm | 39.5 × 10$^{-3}$ Ω | 0.68 × 10$^{-3}$ W/° K | 148.7° K | 87.9 × 10$^{-3}$ | 17.1% |
| 152.4 cm | 197.0 × 10$^{-3}$ Ω | 0.14 × 10$^{-3}$ W/° K | 474.2° K | 88.1 × 10$^{-3}$ | 35.0% |

As can be seen from Table 9, increasing the length of electrical conductors 114c, 116c increases the equivalent electrical resistance ($R_{eq}$) but lowers the equivalent thermal conductance ($K_{eq}$) sufficiently such that the product of the equivalent electrical resistance and equivalent thermal conductance is reduced. This results in an overall increase to the figure of merit (Z), which in turn results in a higher efficiency for thermoelectric device 110. Additionally, because of the increased thermal distance between top plate 120 and bottom plate 122 due to the length of electrical conductors 114c, 116c, the amount of heat that is transferred from top plate 120 to bottom plate 122 is reduced to thereby

D. Insulation

In another aspect of the invention, thermoelectric device 110 as shown in FIG. 2 is able to achieve higher efficiencies due to the use of insulation plate 128 and insulation area 130, as described below.

Thermoelectric Device 110 (Example 4)

As heat is applied to top plate 120, the heat can be absorbed by the ambient air or travel to bottom plate 122. Insulation plate 128 defines an insulation area 130 that prevents at least a portion of the heat applied to top plate 120 from being absorbed into the ambient air. Although the amount of heat retained within insulation area 130 cannot be calculated using the temperature or efficiency equations set forth above, it can be appreciated that insulation plate 128 and insulation area 130 enable top plate 120 to achieve higher temperatures than would be possible without them, which results in higher efficiencies for thermoelectric device 110.

The amount of heat retained within insulation area 130 is dependent on the material of insulation plate 128 and the size and characteristics of insulation area 130. Insulation plate 128 may be made of glass, acrylic or any other material that allows heat to pass through insulation plate 128 to top plate 120 but that prevents heat from being dissipated into the ambient air. In one example, insulation plate 128 is made of glass and insulation area 130 is a vacuum or partial vacuum that extends from insulation plate 128 to top plate 120. Alternatively, insulation area 130 could extend from insulation plate 128 to bottom plate 122, e.g., an entire solar panel could be retained within a vacuum. In this case, the solar panel should be raised so that is positioned off of the roof or other structure supporting the solar panel so that air can flow under and cool the bottom of the solar panel. To create a vacuum in insulation area 130, side membranes or other walls (not shown) may be used to enclose insulation area 130 between insulation plate 128 and top plate 120 (or bottom plate 122). Insulation area 130 may alternatively comprise a gas (e.g., air or argon) that is maintained at a pressure greater than, equal to, or less than the surrounding atmospheric pressure. Of course, if insulation area 130 extends between insulation plate 128 and bottom plate 122, the insulation material must be capable of surrounding element assemblies 114, 116.

While the use of insulation plate 128 and insulation area 130 will increase the efficiency of thermoelectric device 110 in many types of applications, there are certain applications in which their use would actually inhibit the transfer of heat from the heat source to tope plate 120. For example, applications with a constant direct heat source (e.g., a boiler or engine) would not benefit from their use. Thus, the use of insulation plate 128 and insulation area 130 are optional and may not be included in certain embodiments of the present invention.

E. Summary

As described above, the present invention includes various aspects that enable thermoelectric device 110 to generate electrical power more efficiently than a conventional thermoelectric device. The efficiency can be increased in a number of different ways. In one aspect of the invention, one or both of element assemblies 114, 116 are made using semiconductor materials with higher Seebeck coefficients that are not suitable for use with a conventional thermoelectric device. In another aspect of the invention, the distance between element assemblies 114, 116 is increased relative to that in a conventional thermoelectric device. In another aspect of the invention, the length of electrical conductors 114c, 116c and thermal distance between top plate 120 and bottom plate 122 is increased to improve efficiency. In yet another aspect, an insulation plate 128 is provided above top plate 120 to reduce the amount of heat that is lost to the ambient air. To further increase the electrical power generated and delivered to a load, multiple thermoelectric devices 110 can be connected to a single load, preferably by using the connection method shown in FIG. 3. Thus, one skilled in the art will understand that one, two, three or all four aspects of the invention described above may be used to increase the efficiency of a thermoelectric device in accordance with the present invention. Of course, thermoelectric device 110, which includes a combination of all aspects of the invention described above, is preferred and is significantly more efficient than a conventional thermoelectric device.

II. Heating/Cooling Applications

Figure 4:
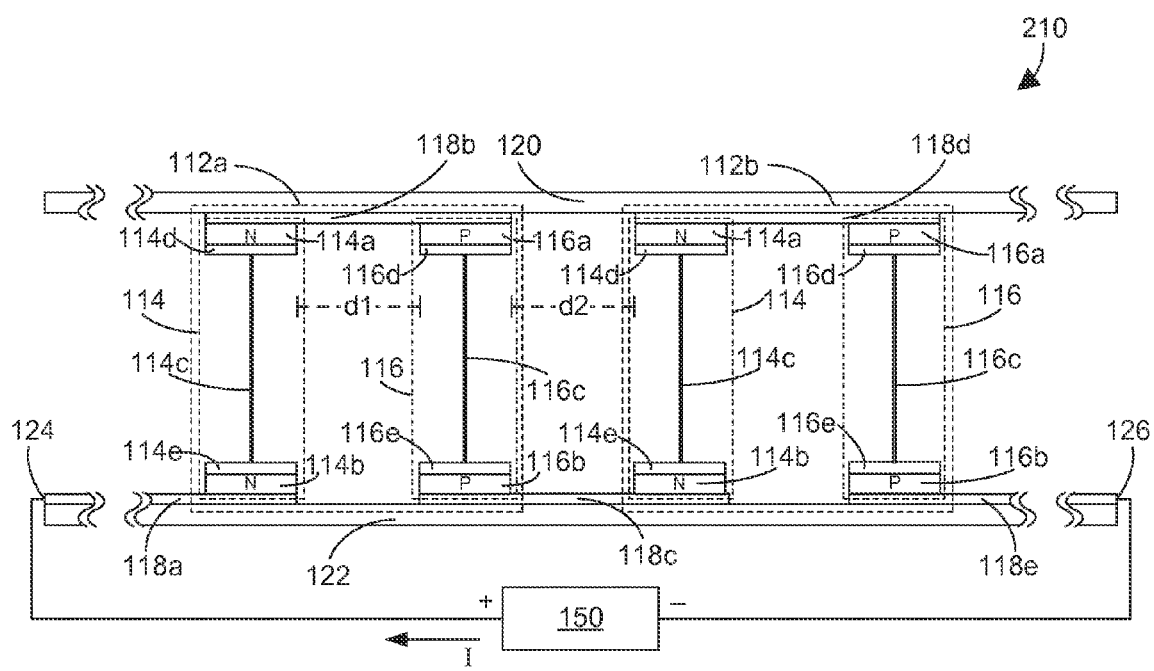
FIG. 4 is a diagram of a thermoelectric device used for heating/cooling applications in accordance with a second exemplary embodiment of the present invention.

Referring to FIG. 4, a second exemplary embodiment of a thermoelectric device used for heating and cooling applications in accordance with the present invention is shown generally as reference numeral 210. Thermoelectric device 210 is identical to thermoelectric device 110 shown in FIG. 2 (wherein the same reference numbers are used to denote the same elements) with the exception that (1) thermoelectric device 210 does not include insulation plate 128 and (2) the connection points 124, 126 of thermoelectric device 210 are connected to a power source 150 rather than a load.

By connecting thermoelectric device 210 to power source 150, thermoelectric device 210 functions as a heating device or cooling device. As power source 150 provides electrical power to thermoelectric device 210, one of top and bottom plates 120, 122 increases in temperature while the other plate decreases in temperature. In this embodiment, the term "hot plate" refers to the plate of thermoelectric device 210 that increases in temperature when a power source is applied to the device and the term "cold plate" refers to the plate of thermoelectric device 210 that decreases in temperature when a power source is applied to the device.

Which of top plate 120 and bottom plate 122 is the hot plate vs. the cold plate is dependent on the direction of the current from power source 150. For example, FIG. 4 identifies the polarity of power source 150 such that the current flows to the left. In this example, top plate 120 will decrease in temperature and function as the cold plate while bottom plate 122 will increase in temperature and function as the hot plate. If the polarity of power source 150 is reversed such that the current flows to the right, then top plate 120 will increase in temperature and function as the hot plate while bottom plate 122 will decrease in temperature and function as the cold plate. The amount and rate that the plates heat or cool is dependent on the configuration and materials of thermoelectric device 210, the amount of electrical power provided by power source 150, and the amount of heat removed from the hot plate by deliberate heat dissipation or losses in the device.

Power source 150 may be any type of power source that generates direct current (DC) to provide electrical power to thermoelectric device 210. The polarity of power source 150 may be reversible such that the same power source can be used to provide current in both directions to thermoelectric device 210. Alternatively, a switch could be provided to switch the direction of the current to thermoelectric device 210. Power source 150 may provide a constant amount of current in a continuous manner, or the current may be dynamic so as to change depending on the state of thermoelectric device 210 and the device desired to be heated or cooled.

Figure 5:
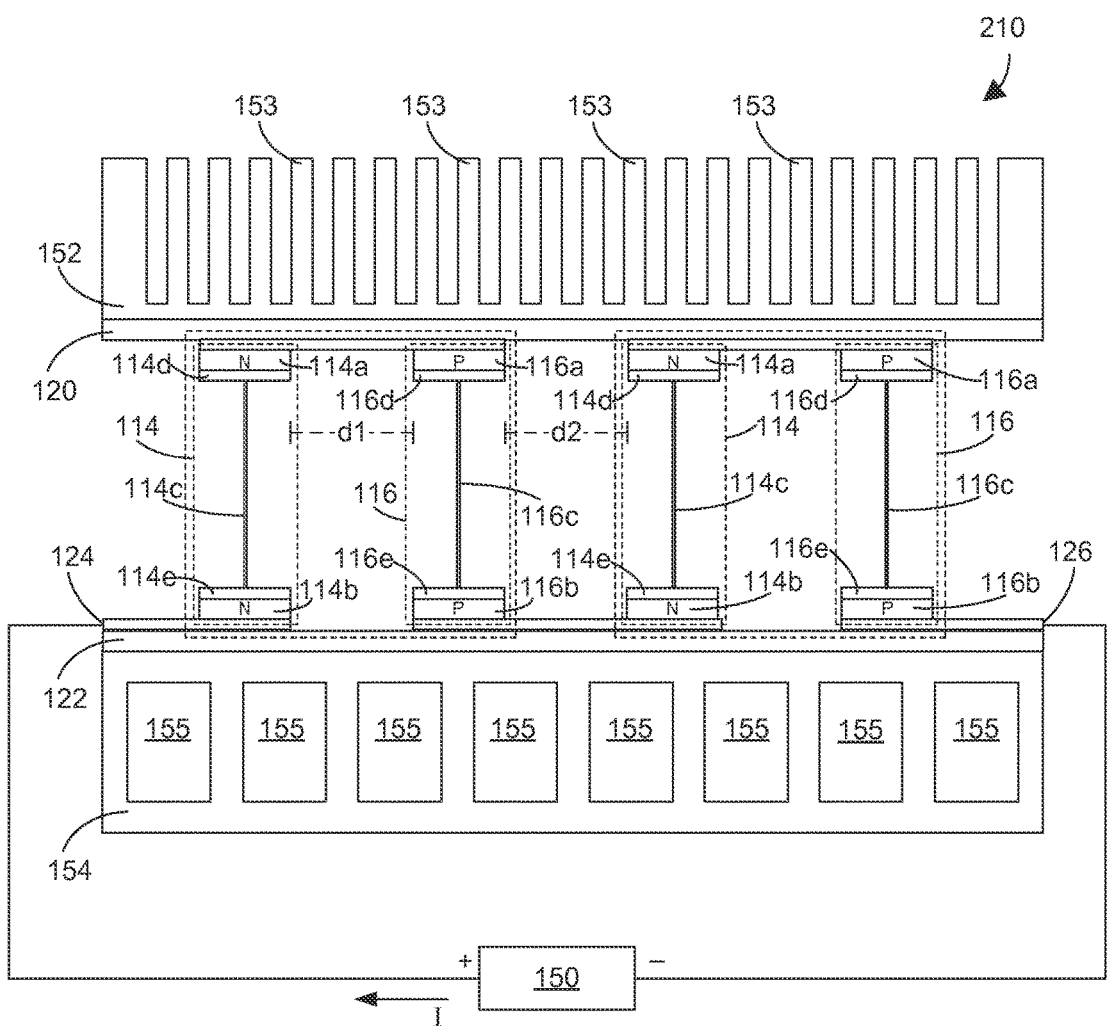
FIG. 5 is a diagram of the thermoelectric device of FIG. 4 when configured for a cooling application.
Figure 6:
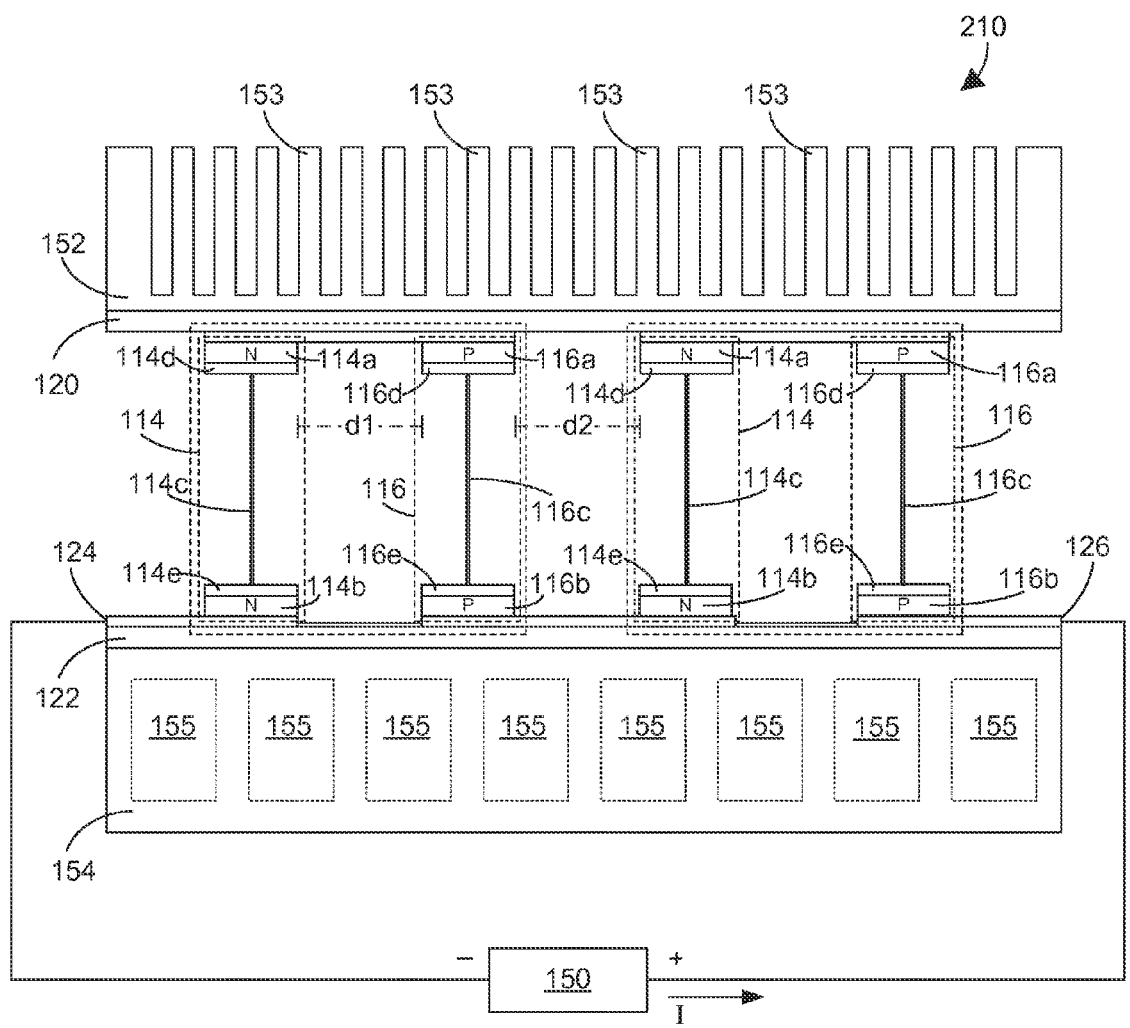
FIG. 6 is a diagram of the thermoelectric device of FIG. 4 when configured for a heating application.

Referring to FIGS. 5 and 6, an example is provided in which thermoelectric device 210 is used for cooling (FIG. 5) or heating (FIG. 6). In this example, thermoelectric device 210 includes a top heat sink 152 coupled to top plate 120 and a bottom heat sink 154 coupled to bottom plate 122. Top heat sink 152 includes fins 153 that provide a greater surface area so as to more quickly dissipate the heat from top plate 120 into the surrounding air. Bottom heat sink 154 includes a plurality of openings 155 that allow air to pass through heat sink 154 to more quickly dissipate the heat from bottom plate 122 into the surrounding air. FIG. 5 shows bottom heat sink 154 in an open position such that air can flow through openings 155. FIG. 6 shows bottom heat sink 154 in a closed position such that air cannot flow through openings 155. Preferably, bottom heat sink 154 can automatically switch between open and closed positions based upon the direction of current provided to thermoelectric device 210. Alternatively, bottom heat sink 154 may be operated manually. One skilled in the art will recognize that air can be prevented from flowing through openings 155 in many ways, including, but not limited to, membranes, doors, windows, hatches, etc. In this example, bottom heat sink 154 includes electrically operated doors to prevent air from flowing through openings 155. The electrically operated doors automatically move to the open position when current flows to the left (as shown in FIG. 5) and automatically move to the closed position when current flows to the right (as shown in FIG. 6).

In an exemplary application, thermoelectric device 210 as shown in FIGS. 5 and 6 is used to heat or cool the air in a building. In this case, thermoelectric device 210 is placed in an exterior wall of the building (not shown) such that bottom heat sink 154 is on the outside of the wall and top heat sink 152 is on the inside of the wall. Bottom plate 122 is preferably flush with the outside of the wall, but may extend inside or outside of the wall. Top plate 120 is preferably flush with the inside of the wall, but may extend inside or outside of the wall. Top heat sink 152 is placed in a heating/cooling air duct (not shown) such that air blown across fins 153 of top heat sink 152 will be heated or cooled depending upon the temperature of top plate 120.

For thermoelectric device 210 to be configured for cooling, power source 150 provides electrical power as shown in FIG. 5 with the current flowing to the left. This causes top plate 120 to decrease in temperature, which in turn causes top heat sink 152 to decrease in temperature. A fan or other air movement device (not shown) can then move the air through the air duct across top heat sink 152 so as to cool the air. The cooled air is then delivered via the air duct to the building.

In operation, as the temperature of top plate 120 and top heat sink 152 decrease so as to cool the air in the building, the temperature of bottom plate 122 and bottom heat sink 154 increase so as to generate heat. Because bottom heat sink 154 is on the outside of the wall, the heat is dissipated to the outside air. To avoid damage to the wall and other negative impacts of bottom plate 122 becoming too hot, bottom heat sink 154 is in an open position such that air can travel through openings 155 to more quickly dissipate the heat from bottom plate 122 into the outside air. Additionally, a fan (not shown) can be used to increase the air flow through openings 155 to more quickly dissipate the heat from bottom plate 122 to the outside air.

For thermoelectric device 210 to be configured for heating, power source 150 provides electrical power as shown in FIG. 6 with the current flowing to the right. This causes top plate 120 to increase in temperature, which in turn causes top heat sink 152 to increase in temperature. A fan or other air movement device (not shown) can then move the air through the air duct across top heat sink 152 so as to heat the air. The heated air is then delivered via the air duct to the building.

In operation, as the temperature of top plate 120 and top heat sink 152 increase so as to heat the air in the building, the temperature of bottom plate 122 and bottom heat sink 154 decrease. In this case, there is not the same potential for damage and negative impacts from bottom plate 122 becoming too cold as there is when bottom plate 122 becomes too hot. Thus, when configured as a heating device, bottom heat sink 154 is in a closed position such that air cannot pass through openings 155.

When the desired temperature inside the building is achieved, power source 150 stops providing electrical power to thermoelectric device 210. Because top plate 120 is on the inside of the wall (at the inside temperature) and bottom plate 122 is on the outside of the wall (at the outside temperature), there is a temperature difference between the two plates. Optionally, connection points 124, 126 could then be switched to a load whereby thermoelectric device 210 generates electrical power as a result of the temperature difference between the plates so as to deliver power to the load.

When configured as a heating device or cooling device, thermoelectric device 210 is not perfectly efficient and energy is lost to the ambient air and to heat generated within the device. The efficiency of thermoelectric device 210 when configured as a heating device is expressed in terms of the coefficient of performance for heating (COPH). On the other hand, the efficiency of thermoelectric device 210 when configured as a cooling device is expressed in terms of the coefficient of performance for cooling or refrigeration (COPR). In general terms, the COPH and COPR are measured by the ratio of the heating or cooling provided to the electrical energy consumed. A thermoelectric device with a higher coefficient of performance will consume less energy for the same amount of heating or cooling, or, will provide more heating or cooling for the same amount of energy. It is believed that a COPH in the range of 5 to 20 and a COPR in the range of 4 to 10 can be achieved in accordance with the present invention.

The COPR represents the ratio of the amount of cooling provided to the cold plate (i.e., top plate 120 in FIG. 5 or bottom plate 122 in FIG. 6) to the amount of electrical energy consumed by thermoelectric device 210, as expressed by the following equation:

$$COPR = \frac{Q_c}{I \cdot (S_m \cdot \Delta T + I \cdot R_m)} \quad (19)$$

where
COPR=coefficient of performance for cooling or refrigeration;
$Q_c$=heat removed from cold plate in watts;
I=current provided by power source in amps;
$S_m$=Seebeck coefficient for thermoelectric module in µV/°K;
$\Delta T$=temperature difference between hot plate and cold plate in °K; and
$R_m$=electrical resistance of thermoelectric module in ohms.

The COPH represents the ratio of the amount of heating provided to the hot plate (i.e., top plate 120 in FIG. 6 or bottom plate 122 in FIG. 5) to the amount of electrical energy consumed by thermoelectric device 210, as expressed by the following equation:

$$COPH = \frac{Q_h}{I \cdot (S_m \cdot \Delta T + I \cdot R_m)} \quad (20)$$

where
COPH=coefficient of performance for heating;
$Q_h$=heat supplied to hot plate in watts;
I=current provided by power source in amps;

$S_m$=Seebeck coefficient for thermoelectric module in $\mu V/° K$;

$\Delta T$=temperature difference between hot plate and cold plate in $° K$; and $R_m$=electrical resistance of thermoelectric module in ohms.

The Seebeck coefficient for thermoelectric device 210 (also referred to as a thermoelectric module) is the equivalent Seebeck coefficient for a single thermoelectric couple multiplied by the number of thermoelectric couples in the module, as shown by the following equation:

$$S_m = n \cdot S_{eq} \qquad (21)$$

where $S_m$=Seebeck coefficient for thermoelectric module in $\mu V/° K$;

n=number of thermoelectric couples in thermoelectric module; and $S_{eq}$=equivalent Seebeck coefficient for single thermoelectric couple in $\mu V/° K$.

Similarly, the electrical resistance for the thermoelectric module is the equivalent electrical resistance for a single thermoelectric couple multiplied by the number of thermoelectric couples in the module, as shown by the following equation:

$$R_m = n \cdot R_{eq} \qquad (22)$$

where $R_m$=electrical resistance for thermoelectric module in ohms;

n=number of thermoelectric couples in thermoelectric module; and $R_{eq}$=equivalent electrical resistance for single thermoelectric couple in ohms.

The amount of heat supplied to the hot plate (i.e., top plate 120 in FIG. 6, bottom plate 122 in FIG. 5) is calculated by the following equation:

$$Q_h = S_m \cdot I \cdot T_h - \tfrac{1}{2} \cdot I^2 \cdot R_m + K_m \cdot \Delta T \qquad (23)$$

where $Q_h$=amount of heat supplied to hot plate in watts;

$S_m$=Seebeck coefficient for thermoelectric module in $\mu V/° K$;

I=current provided by power supply in amps;

$T_h$=temperature of hot plate in $° K$;

$R_m$=electrical resistance of thermoelectric module in ohms;

$K_m$=thermal conductance of thermoelectric module in $W/° K$; and $\Delta T$=temperature difference between hot plate and cold plate in $° K$.

The amount of heat removed from the cold plate (i.e., top plate 120 in FIG. 5, bottom plate 120 in FIG. 6) is calculated by the following equation $$Q_c = S_m \cdot T_c \cdot I - \tfrac{1}{2} \cdot I^2 \cdot R_m - K_m \cdot \Delta T \qquad (24)$$

where $Q_c$=amount of heat absorbed by cold plate in watts;

$S_m$=Seebeck coefficient for thermoelectric module in $\mu V/° K$;

I=current provided by power supply in amps;

$T_c$=temperature of cold plate in $° K$;

$R_m$=electrical resistance of thermoelectric module in ohms;

$K_m$=thermal conductance of thermoelectric module in $W/° K$; and $\Delta T$=temperature difference between hot plate and cold plate in $° K$.

The thermal conductance for the thermoelectric module is the equivalent thermal conductance for a single thermoelectric couple multiplied by the number of thermoelectric couples in the module, as shown by the following equation:

$$K_m = n \cdot K_{eq} \qquad (25)$$

where $K_m$=thermal conductance for thermoelectric module in ohms;

n=number of thermoelectric couples in thermoelectric module; and $K_{eq}$=equivalent thermal conductance for single thermoelectric couple in ohms.

From these equations, it will be seen that the COPR and COPH of a thermoelectric module in accordance with the present invention can be increased in one or more different ways, including: using semiconductor materials with higher Seebeck coefficients that are not suitable for use with a conventional thermoelectric device; and decreasing the length of electrical conductors 114c, 116c and decreasing the thermal distance between top plate 120 and bottom plate 122.

A. Change in Semiconductor Materials

In one aspect of the invention, the configuration of thermoelectric device 210 shown in FIGS. 4-6 enables the use of semiconductor materials with higher Seebeck coefficients that are not suitable for use with conventional thermoelectric device 10 shown in FIG. 1. These semiconductor materials increase the COPR and COPH of thermoelectric device 210. To illustrate this aspect of the invention, an example is provided below that compares the COPR and COPH of conventional thermoelectric device 10 to the COPR and COPH of thermoelectric device 210.

Thermoelectric Device 10 (Prior Art)

As discussed above, thermoelectric device 10 is comprised of n-type semiconductor elements 14 and p-type semiconductor elements 16. For purposes of this example, we will assume the following: (1) n-type semiconductor elements 14 are made of $Bi_2Te_3$+0.1% I and p-type semiconductor elements 16 are made of $Bi_2Te_3$, which have the properties shown in Table 1 above; (2) semiconductor elements 14, 16 each have a length of 1 cm, a width of 1 cm, and a height of 9 cm; (3) thermoelectric device 10 is placed in an exterior wall; (4) a power supply provides 10 amps of current to thermoelectric device 10; (5) the temperature of the cold plate ($T_c$) is 273° K and the temperature of the hot plate ($T_h$) is 303° K; and (6) thermoelectric device 10 includes ten thermoelectric couples (n=10).

The Seebeck coefficient for thermoelectric device 10 is calculated using equation (21) above, as follows:

$$S_m = n \cdot (S_p - S_n) = 10 \cdot (240 \times 10^{-6} - (-184 \times 10^{-6})) = 4240 \times 10^{-6} \text{ V/° K}$$

The electrical resistance of thermoelectric device 10 is calculated using equation (22) above, as follows:

$$R_m = n \cdot (R_n + R_p)$$
$$= n \cdot \left(\rho_n \cdot \left(\frac{h_n}{SA_n}\right) + \rho_p \cdot \left(\frac{h_p}{SA_p}\right)\right)$$
$$= 10 \cdot \left(0.52 \times 10^{-3} \cdot \left(\frac{9.00}{1}\right) + 0.63 \times 10^{-3} \cdot \left(\frac{9.00}{1}\right)\right)$$
$$= 103.5 \times 10^{-3} \ \Omega$$

The thermal conductance of thermoelectric device 10 is calculated using equation (25) above, as follows:

$$K_m = n \cdot (K_n + K_p)$$
$$= n \cdot \left(k_n \cdot \left(\frac{SA_n}{h_n}\right) + k_p \cdot \left(\frac{SA_p}{h_p}\right)\right)$$
$$= 10 \cdot \left(0.26 \cdot \left(\frac{1}{9.00}\right) + 0.02 \cdot \left(\frac{1}{9.00}\right)\right)$$
$$= 50.7 \times 10^{-3} \ \frac{W}{^\circ K}$$

Now, the amount of heat supplied to the hot plate of thermoelectric device 10 is calculated using equation (23) above, as follows:

$$Q_h = S_m \cdot I \cdot T_h - \frac{1}{2} \cdot I^2 \cdot R_m + K_m \cdot \Delta T$$
$$= (4240 \times 10^{-6}) \cdot (10) \cdot (303) - \frac{1}{2} \cdot (10)^2 \cdot (103.5 \times 10^{-3}) +$$
$$(50.7 \times 10^{-3}) \cdot (30)$$
$$= 9.19 \ W$$

The COPH for thermoelectric device 10 is then calculating using equation (20) above, as follows:

$$COPH = \frac{Q_h}{I \cdot (S_m \cdot \Delta T + I \cdot R_m)}$$
$$= \frac{9.19}{10 \cdot [(4240 \times 10^{-6}) \cdot (30) + 10 \cdot (103.5 \times 10^{-3})]}$$
$$= 0.791$$

Similarly, the amount of heat removed from the cold plate of thermoelectric device 10 is calculated using equation (24) above, as follows:

$$Q_c = S_m \cdot T_c \cdot I - \frac{1}{2} \cdot I^2 \cdot R_m + K_m \cdot \Delta T$$
$$= (4240 \times 10^{-6}) \cdot (273) \cdot (10) - \frac{1}{2} \cdot (10)^2 \cdot (103.5 \times 10^{-3}) -$$
$$(50.7 \times 10^{-3}) \cdot (30)$$
$$= 4.88 \ W$$

The COPR for thermoelectric device 10 is then calculated using equation (19) above, as follows:

$$COPR = \frac{Q_c}{I \cdot (S_m \cdot \Delta T + I \cdot R_m)}$$
$$= \frac{4.88}{10 \cdot [(4240 \times 10^{-6}) \cdot (30) + 10 \cdot (103.5 \times 10^{-3})]}$$
$$= 0.420$$

Thus, thermoelectric device 10 has a COPH of 0.791 and a COPR of 0.420 in the example where the device uses the semiconductor materials shown in Table 1 above (based on the other assumptions set forth above).

Thermoelectric Device 210

As discussed above, thermoelectric device 210 is comprised of n-type semiconductor elements 114a, 114b connected by electrical conductor 114c and p-type semiconductor elements 116a, 116b connected by electrical conductor 116c. For purposes of this example, we will assume the following: (1) n-type semiconductor elements 114a, 114b are made of $Bi_2S_3$ (sintered), p-type semiconductor elements 116a, 116b are made of $Bi_2Te_3$ (i.e., the same material as p-type semiconductor elements 16 of thermoelectric device 10), and electrical conductors 114c, 116c are made of 18 AWG copper wire, which have the properties shown in Table 2 above; (2) semiconductor elements 14a, 14b, 16a, 16b each have a length of 1 cm, a width of 1 cm, and a height of 0.5 cm; (3) electrical conductors 114c, 116c each have a cross-sectional surface area of 0.00823 $cm^2$ (i.e., the surface area for 18 AWG copper wire) and a length of 8.9 cm; (4) thermoelectric device 210 is placed in an exterior wall; (5) a power supply provides 10 amps of current to thermoelectric device 210; (6) the temperature of the cold plate ($T_c$) is 273° K and the temperature of the hot plate ($T_h$) is 303° K; and (7) thermoelectric device 210 includes ten thermoelectric couples (n=10).

It should be noted that the values for the Seebeck coefficients ($S_p$, $S_n$), electrical resistances ($R_p$, $R_n$), and thermal conductances ($K_p$, $K_n$) for the n-type and p-type semiconductor elements 114a, 114b, 116a, and 116b of thermoelectric device 210 are the same as those calculated in example 1 above for thermoelectric device 110 (because the semiconductor elements are made of the same material and have the same surface area). It should also be noted that the height of each of element assemblies 114, 116 (i.e., 9 cm=0.05 cm height of each of the two semiconductor elements+8.9 cm length of the electrical conductor) is the same as the height of each of semiconductor elements 14, 16 of thermoelectric device 10.

The Seebeck coefficient for thermoelectric device 210 is calculated using equation (21) above, as follows:

$$S_m = n \cdot (S_p - S_n) = 10 \cdot (240 \times 10^{-6} - (-1300 \times 10^{-6})) = 15400 \times 10^{-6} \ V/^\circ K$$

The electrical resistance of thermoelectric device 210 is calculated using equation (22) above, as follows:

$$R_m = n \cdot (2 \cdot R_n + 2 \cdot R_p + R_c)$$
$$= n \cdot \left(2 \cdot R_n + 2 \cdot R_p + 2 \cdot \rho_c \cdot \left(\frac{h_c}{SA_c}\right)\right)$$
$$= 10 \cdot (2 \cdot 5.00 \times 10^{-5} + 2 \cdot 2.60 \times 10^{-5} +$$
$$= 16.78 \times 10^{-7} \cdot \left(\frac{8.90}{0.00823}\right)\right)$$
$$= 37.8 \times 10^{-3} \ \Omega$$

The thermal conductance of thermoelectric device 210 is calculated using equation (25) above, as follows:

$$K_m = n \cdot (K_{neq} + K_{peq})$$
$$= n \cdot \left( \frac{K_n K_c}{K_n + 2K_c} + \frac{K_p K_c}{K_p + 2K_c} \right)$$
$$= n \cdot \left( \frac{K_n \cdot k_c \cdot \left(\frac{SA_c}{h_c}\right)}{K_n + 2 \cdot k_c \cdot \left(\frac{SA_c}{h_c}\right)} + \frac{K_p \cdot k_c \cdot \left(\frac{SA_c}{h_c}\right)}{K_p + 2 \cdot k_c \cdot \left(\frac{SA_c}{h_c}\right)} \right)$$
$$= 10 \cdot \left( \frac{4.12 \cdot 4.01 \cdot \left(\frac{0.00823}{8.9}\right)}{4.12 + 2 \cdot 4.01 \cdot \left(\frac{0.00823}{8.9}\right)} + \frac{0.40 \cdot 4.01 \cdot \left(\frac{0.00823}{8.9}\right)}{0.40 + 2 \cdot 4.01 \cdot \left(\frac{0.00823}{8.9}\right)} \right)$$
$$= 73.4 \times 10^{-3} \frac{W}{°K}$$

Now, the amount of heat supplied to the hot plate of thermoelectric device 210 is calculated using equation (23) above, as follows:

$$Q_h = S_m \cdot I \cdot T_h - \frac{1}{2} \cdot I^2 \cdot R_m + K_m \cdot \Delta T$$
$$= (15400 \times 10^{-6}) \cdot (10) \cdot (303) - \frac{1}{2} \cdot (10)^2 \cdot (37.8 \times 10^{-3}) + (73.4 \times 10^{-3}) \cdot (30)$$
$$= 47 \, W$$

The COPH for thermoelectric device 210 is then calculating using equation (20) above, as follows:

$$COPH = \frac{Q_h}{I \cdot (S_m \cdot \Delta T + I \cdot R_m)}$$
$$= \frac{47}{10 \cdot [(15400 \times 10^{-6}) \cdot (30) + 10 \cdot (37.8 \times 10^{-3})]}$$
$$= 5.59$$

Similarly, the amount of heat removed from the cold plate of thermoelectric device 210 is calculated using equation (24) above, as follows:

$$Q_c = S_m \cdot T_c \cdot I - \frac{1}{2} \cdot I^2 \cdot R_m + K_m \cdot \Delta T$$
$$= 15400 \times 10^{-6} \cdot (273) \cdot (10) - \frac{1}{2} \cdot (10)^2 \cdot (37.8 \times 10^{-3}) - (73.4 \times 10^{-3}) \cdot (30)$$
$$= 38 \, W$$

The COPR for thermoelectric device 210 is then calculated using equation (19) above, as follows:

$$COPR = \frac{Q_c}{I \cdot (S_m \cdot \Delta T + I \cdot R_m)}$$
$$= \frac{4.88}{10 \cdot [(15400 \times 10^{-6}) \cdot (30) + 10 \cdot (37.8 \times 10^{-3})]}$$
$$= 4.52$$

Thus, thermoelectric device 210 has a COPH of 5.59 and a COPR of 4.52 in the example where the device uses the semiconductor materials shown in Table 1 above (based on the other assumptions set forth above).

In view of the above, it can be seen that the COPH of thermoelectric device 210 (COPH=5.59) is 7.06 times greater than the COPH of thermoelectric device 10 (COPH=0.792). This means that thermoelectric device 210 is 7.06 times as efficient in heating the hot plate to the assumed temperature with the power source delivering 10A of current. Similarly, it can be seen that the COPR of thermoelectric device 210 (COPR=4.52) is 10.74 times greater than the COPR of thermoelectric device 10 (COPR=0.421). This means that thermoelectric device 210 is 10.74 times as efficient in cooling the cold plate to the assumed temperature with the power source delivering 10A of current. Thus, using a semiconductor material for n-type semiconductor elements 14a, 14b that is not suitable for use in n-type semiconductor element 14 results in a COPH and COPR for thermoelectric device 210 that cannot be obtained for conventional thermoelectric device 10.

The significant increases in the COPH and COPR of thermoelectric device 210 described above are achieved only by changing the material used for n-type semiconductor elements 114a, 114b. One skilled in the art will appreciate that these increases can be even greater by using a semiconductor material for p-type semiconductor elements 116a, 116b having a Seebeck coefficient with a larger positive value, provided the electrical resistivity of the material is not too high (as discussed above). Thus, the thermoelectric device of the present invention may include any combination of n-type and p-type semiconductor materials that result in an increase in the COPH and COPR of the thermoelectric device in accordance with the teachings of the present invention.

B. Optimize Length of Electrical Conductors/Thermal Distance Between Plates

In another aspect of the invention, thermoelectric device 210 as shown in FIGS. 4-6 is configured such that the length of electrical conductors 114c, 116c and the thermal distance between top plate 120 and bottom plate 122 (also referred to as the "air gap") is chosen to obtain the highest COPH and/or COPR. One skilled in the art will appreciate that certain factors have an impact on the COPH and COPR. For example, increasing the air gap causes an increase in the electrical resistance of the thermoelectric module, which in turn causes a reduction in the COPH and COPR. An another example, decreasing the air gap causes an increase in the thermal conductance of the thermoelectric module, which in turn causes a reduction in the COPH and COPR. One skilled in the art will understand that the equations set forth above may be used to determine the ideal air gap value for a particular application.

C. Summary

As described above, the present invention includes various aspects that enable thermoelectric device 210 to heat and cool the air more efficiently than a conventional thermoelectric device. The COPR and COPH of thermoelectric device 210 can be increased in a number of different ways. In one aspect of the invention, one or both of element assemblies 114, 116 are made using semiconductor materials with higher Seebeck coefficients that are not suitable for use with a conventional thermoelectric device. In another aspect of the invention, the length of electrical conductors 114c, 116c and the thermal distance between top plate 120 and bottom plate 122 are optimized in order to increase the COPR and/or COPH. Thus, one skilled in the art will understand that one or both of these aspects of the invention described above may be used to increase the COPR and COPH of a thermoelectric device in accordance with the present invention. Of course, thermoelectric device 210, which includes both aspects of the invention described above, is preferred.

While the present invention has been described and illustrated hereinabove with reference to several exemplary embodiments, it should be understood that various modifications could be made to these embodiments without departing from the scope of the invention. Therefore, the present invention is not to be limited to the specific configuration and materials of the exemplary embodiments, except insofar as such limitations are included in the following claims.

What is claimed and desired to be secured by Letters Patent is as follows:

1. A thermoelectric device connectable to a power source and configurable for use as either a heating device or a cooling device, said device comprising:
   a first plate spaced from a second plate;
   a plurality of thermoelectric couples positioned between the first and second plates, wherein the thermoelectric couples are electrically connected in series and thermally connected in parallel, wherein each of the thermoelectric couples comprises:
      an n-type element assembly comprising a first n-type semiconductor element connected to a second n-type semiconductor element via a first electrical conductor;
      a p-type element assembly comprising a first p-type semiconductor element connected to a second p-type semiconductor element via a second electrical conductor; and
      wherein the n-type and p-type element assemblies are electrically connected in series and thermally connected in parallel; and
   a first heat sink coupled to the first plate and a second heat sink coupled to the second plate, wherein the second heat sink include a plurality of openings and is moveable between an open position in which air is allowed to pass through the openings and a closed position in which air is prevented from passing through the openings, wherein the second heat sink is in the closed position when the device is configured for use as a heating device, and wherein the second heat sink is in the open position when the device is configured for use as a cooling device.

2. The thermoelectric device of claim 1, wherein the first heat sink is configured for placement adjacent an inside wall of a structure and wherein the second heat sink is configured for placement adjacent an outside wall of the structure.

3. The thermoelectric device of claim 2, wherein at least a portion of the first heat sink is configured for placement inside an air duct of the structure.

4. The thermoelectric device of claim 1, wherein the power source has a first electrical polarity when the device is configured for use as a heating device, and wherein the power source has a second electrical polarity when the device is configured for use as a cooling device.

5. The thermoelectric device of claim 1, wherein the device has a coefficient of performance for heating (COPH) in a range of about 5 to about 20 when the device is configured for use as a heating device.

6. The thermoelectric device of claim 1, wherein the device has a coefficient of performance for refrigeration (COPR) in a range of about 4 to about 10 when the device is configured for use as a cooling device.

7. The thermoelectric device of claim 1, wherein the first and second plates are each formed of polyphenylene sulfide (PPS) doped with boron nitride.

8. The thermoelectric device of claim 1, wherein the first and second plates are each formed of ceramic doped with aluminum nitride.

9. The thermoelectric device of claim 1, wherein the n-type semiconductor elements are each formed of a material having a Seebeck coefficient with a negative value greater than about $-250$ $\mu V/^\circ$ K, and wherein the p-type semiconductor elements are each formed of a material having a Seebeck coefficient with a positive value greater than about 250 $\mu V/^\circ$ K.

10. The thermoelectric device of claim 9, wherein the n-type and p-type semiconductor elements are each formed of a material having a thermal conductivity greater than about 0.1 W/cm·$^\circ$ K.

11. The thermoelectric device of claim 1, wherein the electrical conductors each have a ratio of electrical conductivity to thermal conductivity in a range of $1.3 \times 10^5$ S$^\circ$ K/W to about $1.6 \times 10^5$ S$^\circ$ K/W.

* * * * *